(12) United States Patent
Sabater

(10) Patent No.: US 11,268,810 B2
(45) Date of Patent: Mar. 8, 2022

(54) ANGLE RANDOM WALK MINIMIZATION FOR FREQUENCY MODULATED GYROSCOPES

(71) Applicant: Government of the United States as represented by the Secretary of the Navy, San Diego, CA (US)

(72) Inventor: Andrew B. Sabater, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 503 days.

(21) Appl. No.: 16/507,453

(22) Filed: Jul. 10, 2019

(65) Prior Publication Data
US 2021/0010810 A1    Jan. 14, 2021

(51) Int. Cl.
| G01C 19/5712 | (2012.01) |
| G01C 19/5776 | (2012.01) |
| H03L 7/08 | (2006.01) |

(52) U.S. Cl.
CPC ..... *G01C 19/5776* (2013.01); *G01C 19/5712* (2013.01); *H03L 7/08* (2013.01)

(58) Field of Classification Search
CPC ............ G01C 19/5776; G01C 19/5712; G01C 19/5726; H03L 7/08; H03L 7/0805
See application file for complete search history.

(56) References Cited

U.S. PATENT DOCUMENTS

| 4,939,751 | A * | 7/1990 | Kuroda | G01S 19/29 331/11 |
| 6,249,192 | B1 * | 6/2001 | Gabara | H03K 3/354 327/165 |
| 6,282,249 | B1 * | 8/2001 | Tomesen | H03D 7/165 375/327 |
| 6,317,008 | B1 * | 11/2001 | Gabara | H03J 3/20 331/113 R |
| 7,890,279 | B1 * | 2/2011 | Chow | H03L 7/07 702/72 |
| 2006/0242445 | A1 * | 10/2006 | Aweya | H03L 7/08 713/400 |
| 2008/0223107 | A1 * | 9/2008 | Stewart | G01C 19/5776 73/1.38 |
| 2010/0165349 | A1 | 7/2010 | Strandjord et al. | |
| 2013/0179134 | A1 | 7/2013 | Li | |
| 2013/0181770 | A1 * | 7/2013 | Sasaki | H03L 7/0807 329/307 |

(Continued)

OTHER PUBLICATIONS

Eminoglu et al, "Comparison of Long-Term Stability of AM Versus FM Gyroscopes," in Proc. IEEE International Conference on MEMS2016, Shanghai, China, Jan. 2016, pp. 954-957.
Eminoglu et al, "Chopped Rate-to-Digital FM Gyroscope with 40ppm Scale Factor Accuracy and 1.2dph Bias," in Proc. IEEE ISSCC2018, San Fran. Feb. 2018, pp. 178-180.

(Continued)

*Primary Examiner* — David J Bolduc
(74) *Attorney, Agent, or Firm* — Naval Information Warfare Center, Pacific; Kyle Eppele; J. Eric Anderson

(57) ABSTRACT

Compared to amplitude modulated gyroscopes, frequency modulated (FM) gyroscopes have demonstrated excellent long-term stability. A notable limitation with FM gyroscopes is FM operation can decrease short-term stability. Short-term stability is typically quantified via angle random walk (ARW). The present disclosure provides an FM gyroscope ARW minimization method.

20 Claims, 14 Drawing Sheets

(56) References Cited

U.S. PATENT DOCUMENTS

| | | | | |
|---|---|---|---|---|
| 2014/0029708 | A1* | 1/2014 | Hewavithana | H04L 7/0331 375/375 |
| 2015/0241244 | A1* | 8/2015 | Hsu | G01R 33/02 702/150 |
| 2016/0003618 | A1 | 1/2016 | Boser et al. | |
| 2016/0079991 | A1* | 3/2016 | Pelissier | G06F 30/30 327/158 |
| 2016/0139176 | A1* | 5/2016 | Shirazi | G01P 15/125 73/1.38 |
| 2017/0102248 | A1* | 4/2017 | Maurer | G01C 25/005 |
| 2017/0276484 | A1* | 9/2017 | Marx | H03M 3/422 |
| 2017/0328712 | A1* | 11/2017 | Collin | H03D 7/00 |
| 2018/0164102 | A1* | 6/2018 | Morales | G01C 19/5776 |
| 2018/0371894 | A1* | 12/2018 | Wang | E21B 7/04 |
| 2019/0107395 | A1* | 4/2019 | Palacios Laloy | G01C 19/60 |
| 2019/0145773 | A1* | 5/2019 | Collin | G01C 19/5776 73/504.12 |
| 2020/0018599 | A1* | 1/2020 | Shcheglov | G01C 19/5712 |
| 2020/0091866 | A1* | 3/2020 | Chao | H03B 5/1215 |
| 2020/0150144 | A1* | 5/2020 | Marx | H03L 7/093 |

OTHER PUBLICATIONS

F. L. Walls and J. R. Vig, "Fundamental Limits on the Frequency Stabilities of Crystal Oscillators," IEEE Trans Ultrason Ferroelectr Freq Control, vol. 42, pp. 576-589, 1995.

A. B. Sabater, K. M. Moran, E. Bozeman, A. Wang, and K. Stanzione, "Nonlinear Operation of Inertial Sensors," in Proc. ICAND2018, Maui, USA, Aug. 2018, pp. 1-13.

Simon et al., "Mode Ordering in Tuning Fork Structures . . . ," in Proc. IEEE Sensors, Nov. 2015), 1-4.

Candler et al, "Long-Term and Accelerated Life Testing of a Novel an Accelerated Life Testing . . . ," J. Microelectromech. Syst., vol. 15, pp. 1446-1445.

Tehrani et al, "Operation of a High Quality-Factor Gyroscope in Electromechanical Nonlinearities Regime," J. Micromech. Microeng., vol. 27, pp. 075015, Jan. 2017.

Zurich Instruments, 'HF2LI-PLL Dual Phase-locked Loop', 2019. [Online]. Available: https://www.zhinst.com/products/hf2li/hf2li-pll [Accessed: Jan. 31, 2019].

Leoncini et al., "Fully integrated, 406 A, 5 deg/hr, full digital output Lissajous frequency-modulated gyroscope," in IEEE Trans. Ind. Electron., Nov. 2018.

* cited by examiner

| | $\Phi_{i1}$ | $\Phi_{i2}$ | ... | $\Phi_{in-1}$ | $\Phi_{in}$ |
|---|---|---|---|---|---|
| $\Phi_{j1}$ | $\Delta f_{j1i1}$ / $AWR_{j1i1}$ | $\Delta f_{j1i2}$ / $AWR_{j1i2}$ | | $\Delta f_{j1in-1}$ / $AWR_{j1in-1}$ | $\Delta f_{j1in}$ / $AWR_{j1in}$ |
| $\Phi_{j2}$ | $\Delta f_{j2i1}$ / $AWR_{j2i1}$ | $\Delta f_{j2i2}$ / $AWR_{j2i2}$ | | $\Delta f_{j2in-1}$ / $AWR_{j2in-1}$ | $\Delta f_{j2in}$ / $AWR_{j2in}$ |
| ... | | | | | |
| $\Phi_{jm-1}$ | $\Delta f_{jm-1i1}$ / $AWR_{jm-1i1}$ | $\Delta f_{jm-1i2}$ / $AWR_{jm-1i2}$ | | $\Delta f_{jm-1in-1}$ / $AWR_{jm-1in-1}$ | $\Delta f_{jm-1in}$ / $AWR_{jm-1in}$ |
| $\Phi_{jm}$ | $\Delta f_{jmi1}$ / $AWR_{jmi1}$ | $\Delta f_{jmi2}$ / $AWR_{jmi2}$ | | $\Delta f_{jmin-1}$ / $AWR_{jmin-1}$ | $\Delta f_{jmi1}$ / $AWR_{jmin}$ |

FIG. 8A ically distinct from being listed in this invention.

ANGLE RANDOM WALK MINIMIZATION FOR FREQUENCY MODULATED GYROSCOPES

FEDERALLY-SPONSORED RESEARCH AND DEVELOPMENT

The United States Government has ownership rights in this invention. Licensing inquiries may be directed to Office of Research and Technical Applications, Naval Information Warfare Center, Pacific, Code 3600, San Diego, Calif., 92152; telephone (619) 553-3001; email: ssc_pac_t2@navy.mil. Reference Navy Case No. 109,059.

BACKGROUND OF THE INVENTION

As a gyroscope can sense rotation, they find applications in navigation systems or in motion detection or control systems. The capabilities or performance of these systems depend on the sensitivities of the gyroscope to short-term noise processes, long-term noise processes, temperature, mechanical shock and vibration, or other environmental effects (some have notable magnetic field sensitivities). Microelectromechanical systems (MEMS) gyroscopes provide a very low cost, size, weight, and power (CSWaP) solution to estimate rotation rate, but the performance of current commercially available solutions prohibit their use for navigation without the use of other sensors. Most MEMS gyroscopes employ an amplitude modulated (AM) detection scheme. However, compared to AM gyroscopes, it was shown that FM gyroscopes are able to reduce temperature sensitives and drift due to long-term noise processes. The limitation is that FM operation can elevate short-term noise.

Some MEMS gyroscopes may use a dual mode resonator, for example as described in detail in A. B. Sabater, K. M. Moran, E. Bozeman, A. Wang, and K. Stanzione, "Nonlinear Operation of Inertial Sensors," in Proc. International Conference on Applications in Nonlinear Dynamics (ICAND2018), Maui, USA, August 2018, pp. 1-13, the entire disclosure of which is incorporated herein by reference. The dual mode resonator is used by a quadruple mass gyroscope (QMG) with oscillating portions that has been miniaturized. Based on the nominal design, finite element simulations estimated that the anti-phase modes that are utilized for gyroscope operation would be near twenty-three kilohertz (23 kHz). The mode shape of one of these modes is shown in FIG. 1.

FIG. 1A illustrates a finite element simulation 100 of one of the anti-phase modes of the dual mode resonator that is used for gyroscope operation. As shown in the figure, finite element simulation 100 includes a non-moving portion 102 and a movable portion 104.

In operation, an oscillating driving voltage is applied between contacts (not shown), the voltage generates electric fields that movable portion 104. Movable portion 104 oscillates at a frequency coincident with the frequency of the driving voltage. This oscillation is referred to as a first mode or mode one (1) of oscillation.

FIG. 1B illustrates a finite element simulation 106 of the other of the anti-phase modes of the dual mode resonator that is used for gyroscope operation. As shown in the figure, finite element simulation 106 includes a non-moving portion 108 and a movable portion 110.

In operation, an oscillating driving voltage is applied between contacts (not shown), the voltage generates electric fields that movable portion 110. Movable portion 110 oscillates at a frequency coincident with the frequency of the driving voltage. This oscillation referred to as a second mode or mode two (2) of oscillation and is orthogonal to the first mode of oscillation.

The majority of MEMS gyroscopes employ an amplitude modulated (AM) scheme for modulating the dual mode resonator. However, compared to amplitude modulated gyroscopes, frequency modulated (FM) gyroscopes have demonstrated excellent long-term stability. A notable limitation with FM gyroscopes is FM operation can decrease short-term stability. Short-term stability is typically quantified via angle random walk (ARW).

There exists a need to improve angle random walk minimization in a dual mode resonator of a quadruple mass FM gyroscope.

SUMMARY OF THE INVENTION

An aspect of the present disclosure is drawn to a method of determining a driving signal for a dual mode resonator of a gyroscope. The method includes driving, via a first mode phase-locked loop (PLL) set at first mode phase, a first mode of the dual mode resonator. The method additionally includes obtaining, via a detector, a first mode power spectral density (PSD) value of the dual mode resonator, a first mode amplitude of the dual mode resonator and a first mode frequency of the dual mode resonator based on the PLL set at the first mode phase. The method additionally includes repeating the driving of the first mode of the dual mode resonator and the obtaining a respective first mode PSD value, a respective first mode amplitude of the dual mode resonator and a respective first mode frequency of the dual mode resonator based on the PLL set at a respective first mode phase a number n times to obtain n respective first mode PSD values of the dual mode resonator, n respective first mode amplitudes of the dual mode resonator and n respective first mode frequencies of the dual mode resonator. Each repetition of the driving of the first mode of the dual mode resonator and the obtaining a respective first mode PSD value, a respective first mode amplitude of the dual mode resonator and a respective first mode frequency of the dual mode resonator having the first mode PLL being set at a different respective first mode phase. The method additionally includes driving, via a second mode PLL set at second mode phase, a second mode of the dual mode resonator. The method additionally includes obtaining, via the detector, a second mode PSD value of the dual mode resonator, a second mode amplitude of the dual mode resonator and a second mode frequency of the dual mode resonator based on the PLL set at the second mode phase. The method additionally includes repeating the driving the second mode of the dual mode resonator and the obtaining a respective second mode PSD value, a respective second mode amplitude of the dual mode resonator and a respective second mode frequency of the dual mode resonator based on the PLL set at a respective second mode phase a number m times to obtain m respective second mode PSD values of the dual mode resonator, m respective second mode amplitudes of the dual mode resonator and m respective second mode frequencies of the dual mode resonator. Each repetition of the driving the second mode of the dual mode resonator and the obtaining a respective second mode PSD value, a respective second mode amplitude of the dual mode resonator and a respective second mode frequency of the dual mode resonator having the second mode PLL being set at a different respective second mode phase. The method additionally includes determining an angle random walk (ARW), value of the dual mode resonator using the following equation, $$ARW\left(\frac{deg/\sec}{\sqrt{Hz}}\right) = 360 \frac{\sqrt{P_1(\Delta f)\frac{f_s}{2} + P_2(\Delta f)\frac{f_s}{2}}}{\frac{1}{2}A_g\left(\frac{a_1}{a_2} + \frac{a_2}{\alpha_1}\right)},$$

wherein $f_s$ is a sampling frequency. Further, $A_g$ is the angular gain of the dual mode resonator, $a_1$ is the first mode amplitude of the dual mode resonator based on the PLL set at the first mode phase and $a_2$ is the second mode amplitude of the dual mode resonator based on the PLL set at the second mode phase. Still further, $f_1$ is the first mode frequency of the dual mode resonator based on the PLL set at the first mode phase, $f_2$ is the second mode frequency of the dual mode resonator based on the PLL set at the second mode phase and $\Delta f = |f_1 - f_2|$. Furthermore, $P_1(\Delta f)$ is a PSD value of the first mode frequency of the dual mode resonator based on the PLL set at the first mode phase at $\Delta f$ and $P_2(\Delta f)$ is a PSD value of the second mode frequency of the dual mode resonator based on the PLL set at the second mode phase at $\Delta f$.

BRIEF DESCRIPTION OF THE DRAWINGS

The accompanying drawings, which are incorporated in and form a part of the specification, illustrate example embodiments and, together with the description, serve to explain the principles of the disclosure. A brief summary of the drawings follows.

FIG. 8A illustrates a table of $\Delta f$ an ARW for each phase for the first and second modes of the dual mode resonator that is used for gyroscope operation.

DETAILED DESCRIPTION OF THE EMBODIMENTS

Figure 1A:
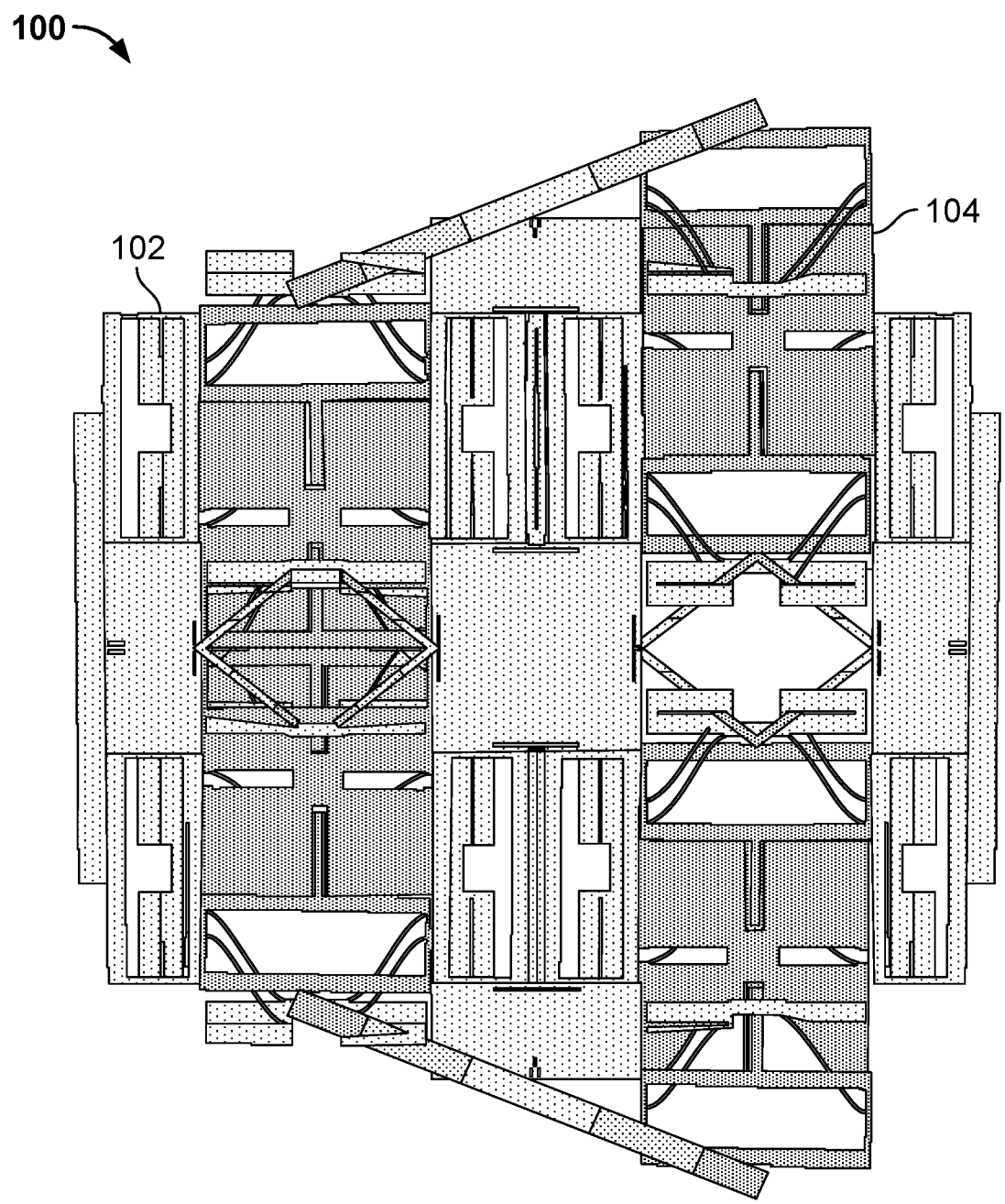
FIG. 1A illustrates a finite element simulation of one of the anti-phase modes of the dual mode resonator that is used for gyroscope operation.

Embodiments of the disclosure relate to minimizing angle random walk in gyroscopes. Disclosed herein is an angle random walk (ARW) minimization method that accounts for the amplitude and frequency fluctuations of different operating conditions for FM gyroscopes. This method is supported by both theoretical and experimental work.

The present disclosure provides a method to minimize angle random walk (ARW) in a frequency modulate (FM) gyroscope having a dual mode resonator. To accomplish the minimization of the ARW, initially a first phase-locked loop (PLL) is driven in a first phase to drive the first mode of the dual mode resonator. A power spectral density (PSD) value, an amplitude and a frequency of the first mode of the dual mode resonator is then measured from this first phase that is used to drive the first mode of the dual mode resonator. This is repeated for a number, n, of phases for the PLL—thus producing corresponding n PSD values, n amplitudes and n frequencies of the first mode of the dual mode resonator. To further accomplish the minimization of the ARW, next a second PLL is driven in a first phase to drive the second mode of the dual mode resonator. A PSD value, an amplitude and a frequency of the second mode of the dual mode resonator is then measured from this first phase that is used to drive the second mode of the dual mode resonator. This is repeated for a number, m, of phases for the PLL—thus producing corresponding m PSD values, m amplitudes and m frequencies of the second mode of the dual mode resonator. To further accomplish the minimization of the ARW, next the measured amplitudes and PSD values for the different phases of both modes of the dual mode resonator are used to generate a contour diagram of model-predicted ARW. From the generated contour diagram of model-predicted ARW, a minimum ARW may be determined. The minimum ARW is associated with a phase in which the first PLL should be driven to drive the first mode of the dual mode resonator and is associated with a phase in which the second PLL should be driven to drive the second mode of the dual mode resonator in order to minimize the ARW of the dual mode resonator. This will be described in more detail below.

A quadruple mass gyroscope design may be used with the minimization method of the present disclosure. Due to the use of narrow one (1) micron (μm) transduction gaps and the high quality factor of the dual mode resonator, a closed-loop frequency response method is used to characterize the response of the device. This characterization method quantifies both the amplitude and frequency fluctuations for different phase relationships between the input and output of the dual mode resonator. The amplitude and frequency fluctuations for different phase relationships between the input and output of the dual mode resonator are then used in an ARW model for FM gyroscopes. This ARW model is used to estimate conditions that minimize ARW. The dual mode resonator used in this work may be the same as described in Sabater et al., as described above.

The effect of blowout, or over-etching, was underestimated resulting in the gyroscope operating closer to 16 kHz. The native frequency split of the device used in this work is close to three hundred Hertz (300 Hz). This relatively large value is believed to also be due to ignoring blowout during the design phase.

The dynamic range, or the range of excitations where the dual mode resonator behaves linearly, of the QMG used in this work is relatively small. This is due to many factors including a narrow one micron (1 μm) transduction gaps and the high quality factor (Q>100,000) of both modes. With a bias voltage of 10 Volts (V), significant nonlinear effects were observed for excitations beyond 100 μV. Characterizing the response of nonlinear systems using open-loop frequency response measurements can be challenging due to issues such as hysteresis. As discussed in more detail below, a closed-loop frequency response measurement method overcomes these issues and is able to quantify both amplitude and frequency fluctuations—both of these quantities are needed as they are related to FM gyroscope ARW.

Using a Zurich Instruments® HF2LI, a phase-locked loop (PLL) was used to control the relative phase between the input and output of the dual mode resonator. By sweeping the reference phase value of the PLL with a given constant excitation level, the full frequency response of the dual mode resonator can be recovered and states that are typically unstable in open-loop testing can be stabilized. While the bandwidth of the dual mode resonator is about one-tenth Hertz (0.1 Hz), the target bandwidth was set at eight (8) Hz.

In addition to allowing for the operation of states that are unstable in open-loop conditions, closed-loop frequency response measurements allow for the quantification of frequency fluctuations. Trials were conducted for both modes of the dual mode resonator and were repeated for validation. A bias voltage of ten (10) V was used and input excitations of one milli-Volt (1 mV) and four (4) mV were considered. Larger excitations resulted in a saturation of the amplitude believed to be due to the oscillating portions impacting during flexing. The phase of the PLL was changed in increments of two degrees (2°).

Frequency random walk has been shown to be significant on time scales greater than 10 sec. Therefore, to keep the total test duration to a modest amount of time, the measurement duration for a given reference phase value was ten seconds (10 sec) with a two (2) sec delay between values to allow for the system to settle. Examples of the amplitude response for the first mode of the dual mode resonator are shown in FIG. 2.

Figure 2:
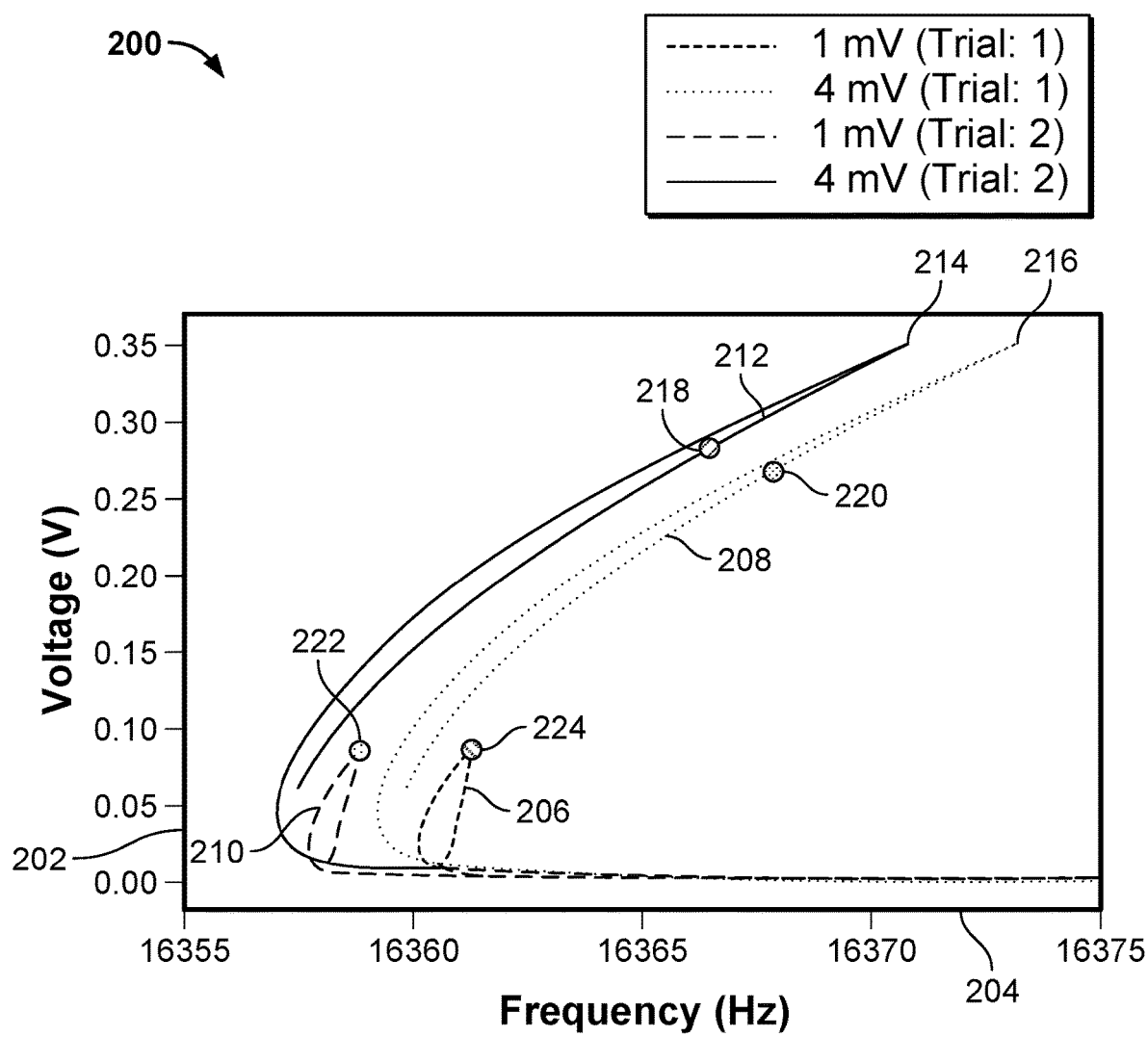
FIG. 2 illustrates a graph of amplitude measurements from closed-loop frequency response trials of a first mode having a 10 V bias.

FIG. 2 illustrates a graph 200 of amplitude measurements from closed-loop frequency response trials of a first mode having a ten Volt (10 V) bias. As shown in the figure, graph 200 includes a y-axis 202, an x-axis 204, a function 206, a function 208, a function 210 and a function 212. Y-axis 202 is the detected voltage amplitude in Volts, whereas x-axis 204 is the driving frequency of the mode in Hz.

Function 206 corresponds to a first trial at 1 mV input excitation, whereas function 208 corresponds to the first trial at 4 mV input excitation. Function 210 corresponds to a second trial (at a later time from the first set of trials) at 1 mV input excitation, whereas function 212 corresponds to the second trial at 4 mV input excitation.

Function 212 has a maximum voltage of about thirty-five one hundredths (0.35) V at a frequency of about sixteen thousand three hundred seventy-one (16371) Hz indicated by point 214, whereas function 208 has a maximum voltage of about 0.35 V at a frequency of about sixteen thousand three hundred seventy-three (16373) Hz indicated by point 216.

Function 210 has a maximum voltage of about seven hundredths (0.07) V at a frequency of about sixteen thousand three hundred fifty eight (16358) Hz indicated by point 222, whereas function 206 has a maximum voltage of about 0.07 V at a frequency of about sixteen thousand three hundred sixty-one) (16361) Hz indicated by point 224.

As can be seen by comparing point 214 of function 212 with point 222 of function 210, and by comparing point 216 of function 208 with point 224 of function 206, it is clear that with an increase of input excitation, there is an increase in amplitude response of the mode.

By comparing the location of function 212 with the location of function 208, and by comparing the location of function 210 with the location of function 206, it is clear that there is a shift in the natural frequency between the two trials. The shift in natural frequency is believed to be due to temperature variations between trails.

Figure 3:
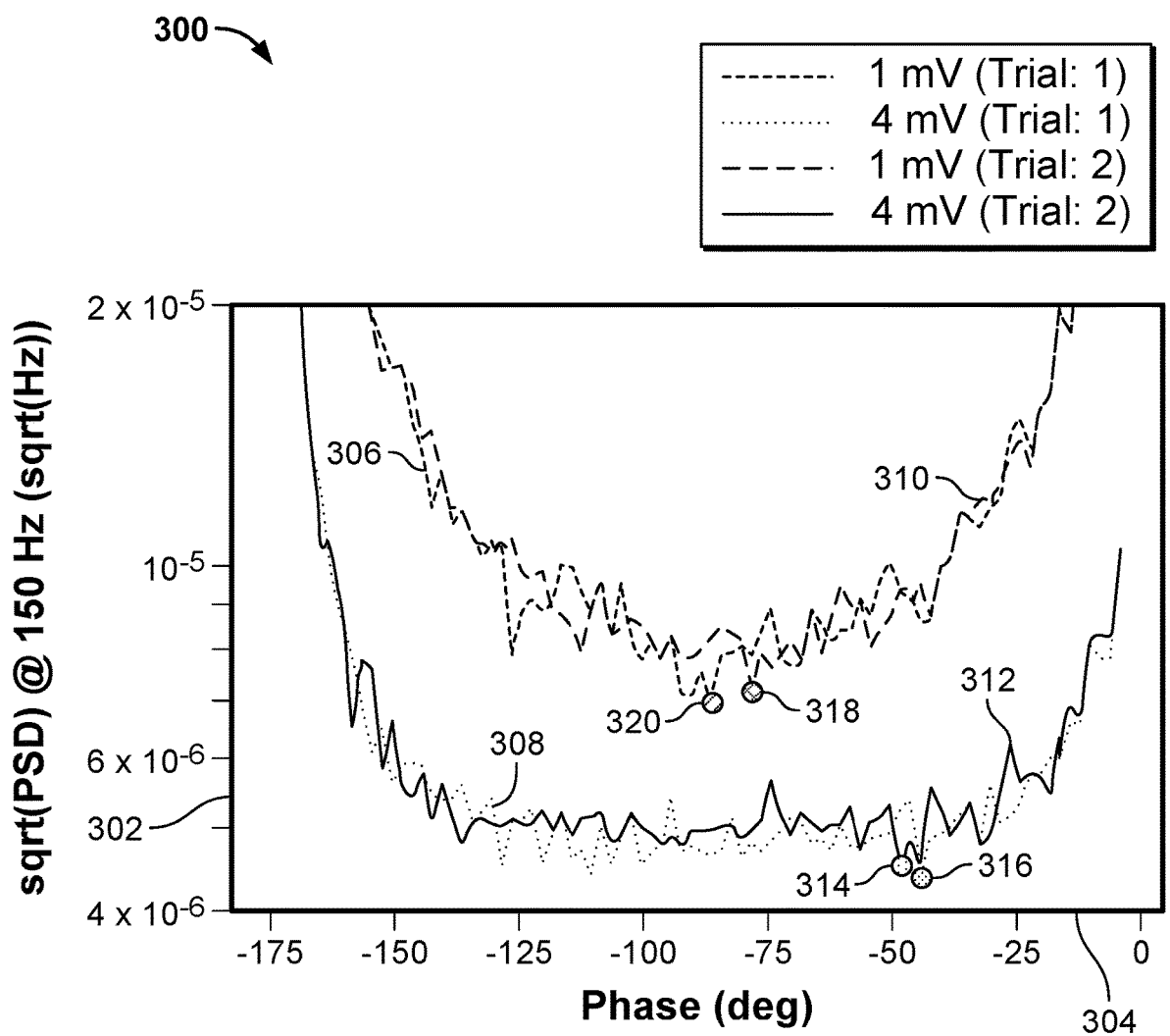
FIG. 3 illustrates a graph of the power spectral distribution at 150 Hz from closed-loop frequency response measurements.

The frequency fluctuation data from the closed-loop frequency response measurements is shown in FIG. 3. FIG. 3 illustrates a graph 300 of the power spectral distribution (PSD) at 150 Hz from closed-loop frequency response measurements.

As shown in the figure, graph 300 includes a y-axis 302, an x-axis 304, a function 306, a function 308, a function 310 and a function 312. Y-axis 302 is the square root of the PSD in $Hz^{1/2}$, whereas x-axis 304 is phase of the phase-locked loop in degrees.

Function 306 corresponds to the first trial at 1 mV input excitation, whereas function 308 corresponds to the first trial at 4 mV input excitation. Function 310 corresponds to the second trial at 1 mV input excitation, whereas function 312 corresponds to the second trial at 4 mV input excitation. Function 306 has a minimum PSD of about $7.0 \times 10^{-6}$ $Hz^{1/2}$ at a frequency of about negative eighty-five degrees (−85°) indicated by point 318, whereas function 308 has a minimum PSD of about $4.50 \times 10^{-6}$ $Hz^{1/2}$ at a frequency of about negative forty-five degrees (−45°) indicated by point 314. Function 310 minimum PSD of about $7.5 \times 10^{-6}$ $Hz^{1/2}$ at a frequency of about negative eighty degrees (−80°) indicated by point 318, whereas function 312 minimum PSD of about $4.55 \times 10^{-6}$ $Hz^{1/2}$ at a frequency of about negative forty-nine degrees (−49°) indicated by point 316.

As can be seen by comparing function 306 with function 308, and by function 310 with function 312, it is clear that with an increase of input excitation, there is a decrease in PSD of the mode. By comparing the function 306 with function 310, and by comparing function 308 with function 312, it is believed that the differences between the sets of functions are due to temperature variations between trails.

While the natural frequency shifted between trials, the trends in functions 306, 308, 310 and 312 of FIG. 3 are consistent. FIG. 3 shows the power spectral density (PSD) of the demodulated frequency at one hundred fifty (150) Hz, which was selected as it corresponds to both the value that was used in gyroscope experiments and nearly optimizes ARW. Point 314 corresponds to the minimum PSD for function 312, point 316 corresponds to the minimum PSD for function 308, point 318 corresponds to the minimum PSD for function 310 and point 320 corresponds to the minimum PSD for function 306. Points 314, 316, 320 and 322 correspond to points 218, 220, 222 and 224, respectively of FIG. 2.

Figure 4:
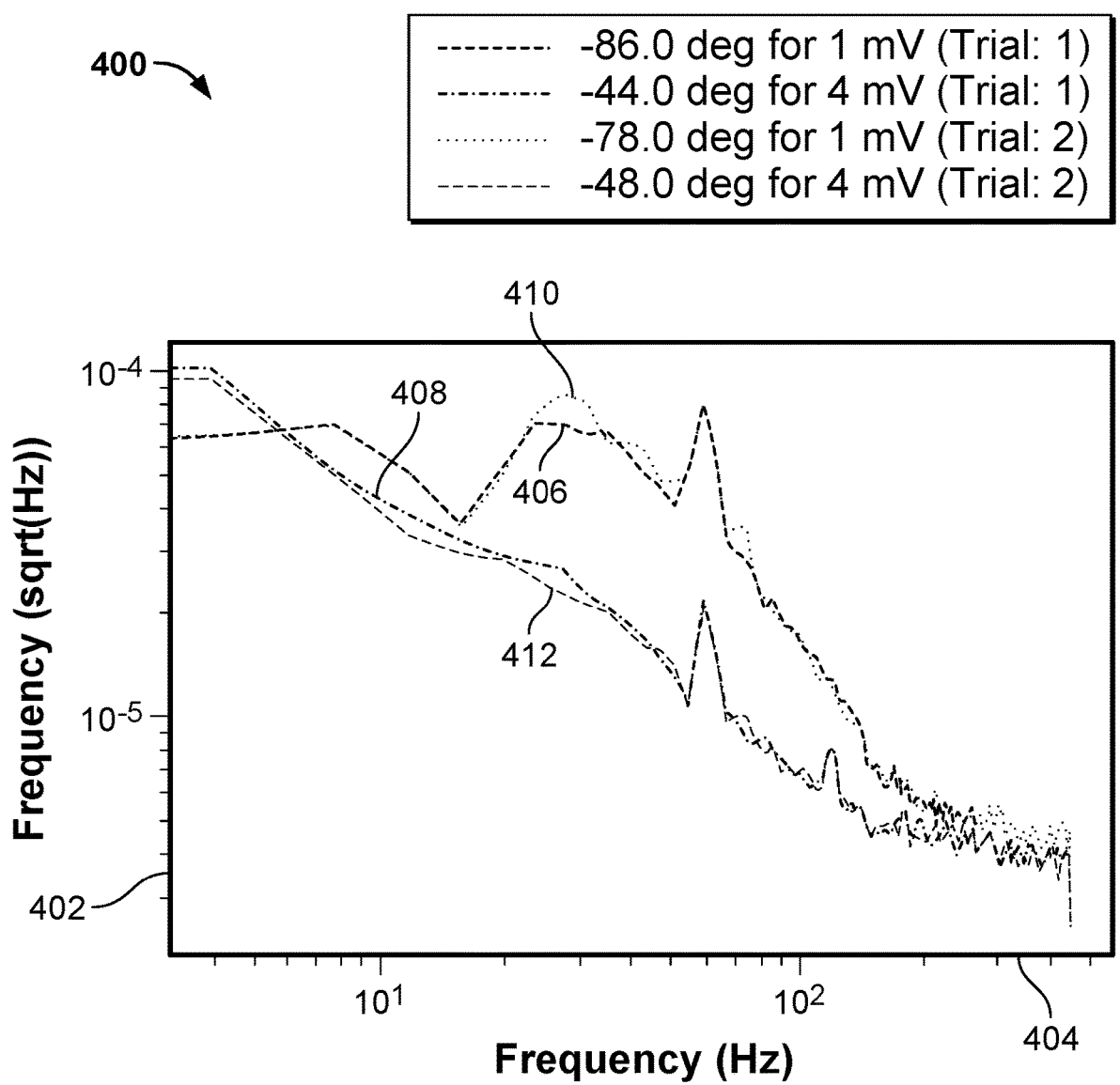
FIG. 4 illustrates a graph of the power spectral distribution PSD from phase states that minimized the PSD at 150 Hz.

FIG. 4 illustrates a graph 400 of the PSD from phase states that minimized the PSD at 150 Hz. As shown in the figure, graph 400 includes a y-axis 402, an x-axis 404, a function 406, a function 408, a function 410 and a function 412. Y-axis 402 is frequency in $Hz^{1/2}$, whereas x-axis 404 is frequency in Hz.

Function 406 corresponds to the first trial at 1 mV input excitation, whereas function 408 corresponds to the first trial at 4 mV input excitation. Function 410 corresponds to the second trial at 1 mV input excitation, whereas function 412 corresponds to the second trial at 4 mV input excitation. As can be seen in graph 400, the general trend in the trials is that as frequency increases, the PSD decreases. The spikes at sixty (60) Hz harmonics in graph 400 are due to power line interference.

PSD was estimated using Welch's method, wherein twenty-five hundredths (0.25) sec segments were used for PSD estimation, resulting in four (4) Hz frequency resolution. This length was selected to balance between frequency resolution and the smoothness of PSD estimation.

There are several important features to point out in the frequency fluctuation data. The first is that the structure of the data is dependent on both the significance of nonlinear effects and the associated time-scale. Due to this complexity, simplistic theoretical models for frequency fluctuations were not developed or considered as they would not accurately describe the observed behavior. In general the larger, more nonlinear response for the 4 mV case is more stable, except for longer-time scales.

Previous works on FM gyroscopes have noted that frequency stability tends to degrade at larger frequency values (i.e. larger PSD values at larger frequencies). Methods and measurements in accordance with the present disclosure show the opposite trend. This is believed to be due to the use of a PLL directly controlling the dual mode resonator. In current work where the PLL has been replaced with analog electronics to sustain oscillations and the PLL is used just to demodulate frequency, the trend of larger PSD values for larger frequencies is observed.

A method of driving a resonator uses Lissajous FM operation. By simultaneously operating both modes of the dual mode resonator at the same time, the oscillation frequency of each mode is modulated at the frequency that corresponds to the frequency split of the two modes. Using phase-sensitive demodulation to reject quadrature error, the modulation depth of this FM signal is proportional to the rotation rate of the gyroscope. Thus, the proposed ARW model is given in equation (1) as $$ARW\left(\frac{deg/\sec}{\sqrt{Hz}}\right) = 360 \frac{\sqrt{P_1(\Delta f)\frac{f_s}{2} + P_2(\Delta f)\frac{f_s}{2}}}{\frac{1}{2}A_g\left(\frac{a_1}{a_2} + \frac{a_2}{a_1}\right)}, \quad (1)$$

where $a_1$ and $a_2$ are the amplitudes of modes 1 and 2, respectively, and $A_g$ is the angular gain. In previous experiments, the angular gain of the dual mode resonator used herein was estimated to be 0.58. $P_1(\Delta f)$ and $P_2(\Delta f)$ are the PSD of the demodulated frequencies of modes 1 and 2 at the frequency $\Delta f$. $\Delta f$ corresponds to the frequency split between the modes 1 and 2. The $f_s/2$ term, where $f_s$ is the sampling frequency, accounts for the scaling associated with PSD estimation.

Using the above model and the data from the closed-loop frequency response measurements, the minimum ARW as a function of frequency split can be calculated. An example for the case that both modes are excited at 4 mV is shown in FIG. 5.

Figure 5:
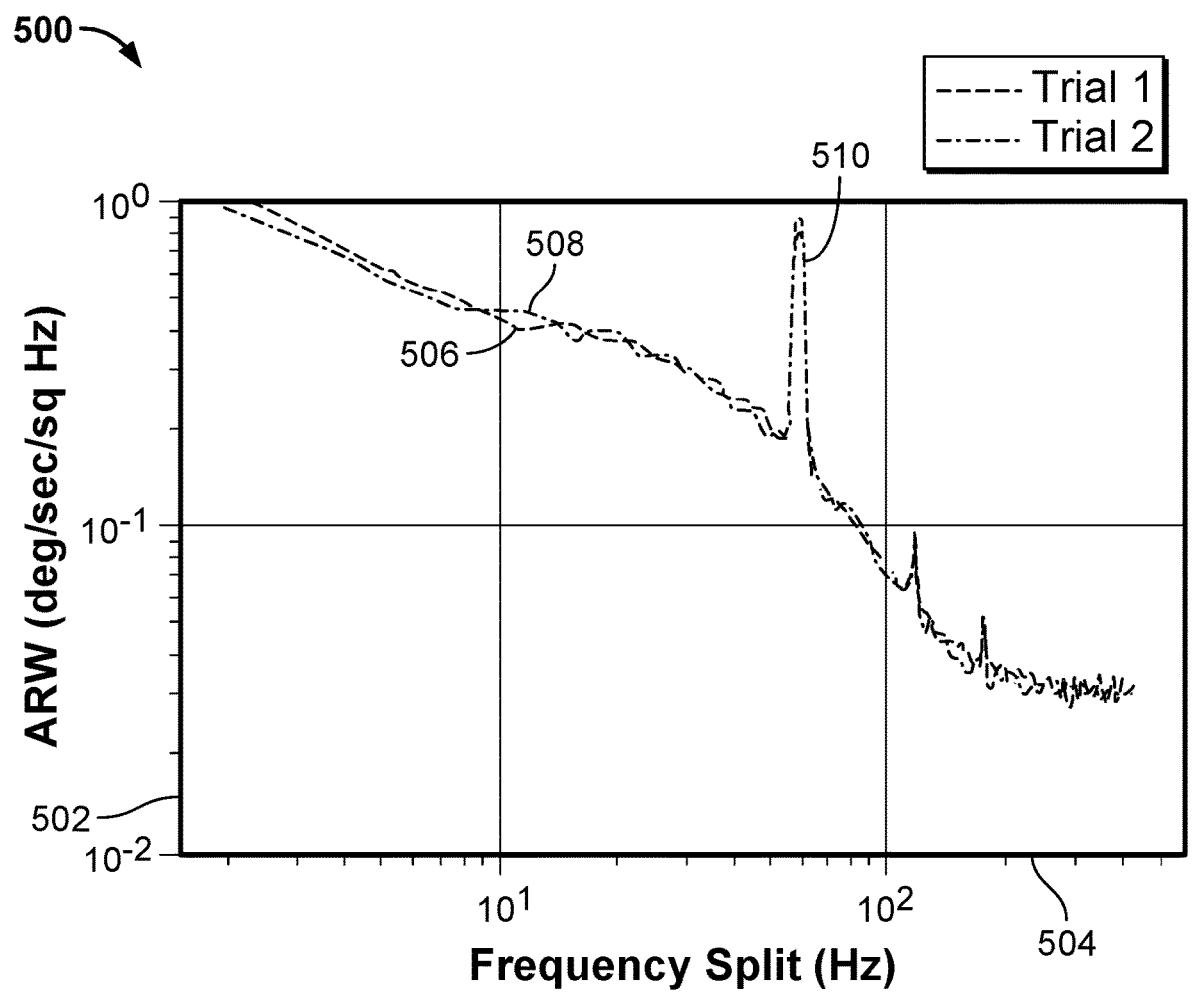
FIG. 5 illustrates a graph of minimum model-predicted ARW based on closed-loop frequency response measurements as a function of frequency split.

FIG. 5 illustrates a graph 500 of minimum model-predicted ARW based on closed-loop frequency response measurements as a function of frequency split. As shown in the figure, graph 500 includes a y-axis 502, an x-axis 504, a function 506 and a function 508. Y-axis 502 is the ARW measured in degrees/second/$Hz^{1/2}$, whereas x-axis 504 is frequency in Hz.

Function 508 corresponds to the first trial at 4 mV input excitation, whereas function 510 corresponds to the second trial at 4 mV input excitation.

To be more explicit about how this calculation is performed, the amplitudes and PSDs of the demodulated frequencies are calculated for all possible combinations of phase feedback values for both modes, the model is used to estimate the ARW for each cases, and the minimum value for a given frequency split value is kept. These kinds of diagrams can be used to aid in the selection of the frequency split between the two modes of the dual mode resonator. Important caveats, however, should be considered. FIG. 5 shows that ARW is minimal for frequency splits greater than two hundred (200) Hz. This is atypical for FM gyroscopes where analog electronics are used to sustain oscillations and a PLL is used to just demodulate frequency. The use of a PLL to directly control the dual mode resonator aids in the suppression of high-frequency noise, so with the PLL configuration in accordance with the present disclosure, one may seek to use as high of a frequency split as possible. However, the model may not be accurate for very large frequency splits. Experiments with frequency splits of three hundred (300) and four hundred (400) Hz measured a much smaller scale factor, so the use of an angular gain that is dependent on frequency split may compensate for this effect, but the current model assumes that the angular gain is a constant. The model also does not capture low frequency effects like synchronization. In experiments, synchronization was observed for cases where the frequency split was less than ten (10) Hz.

Figure 6:
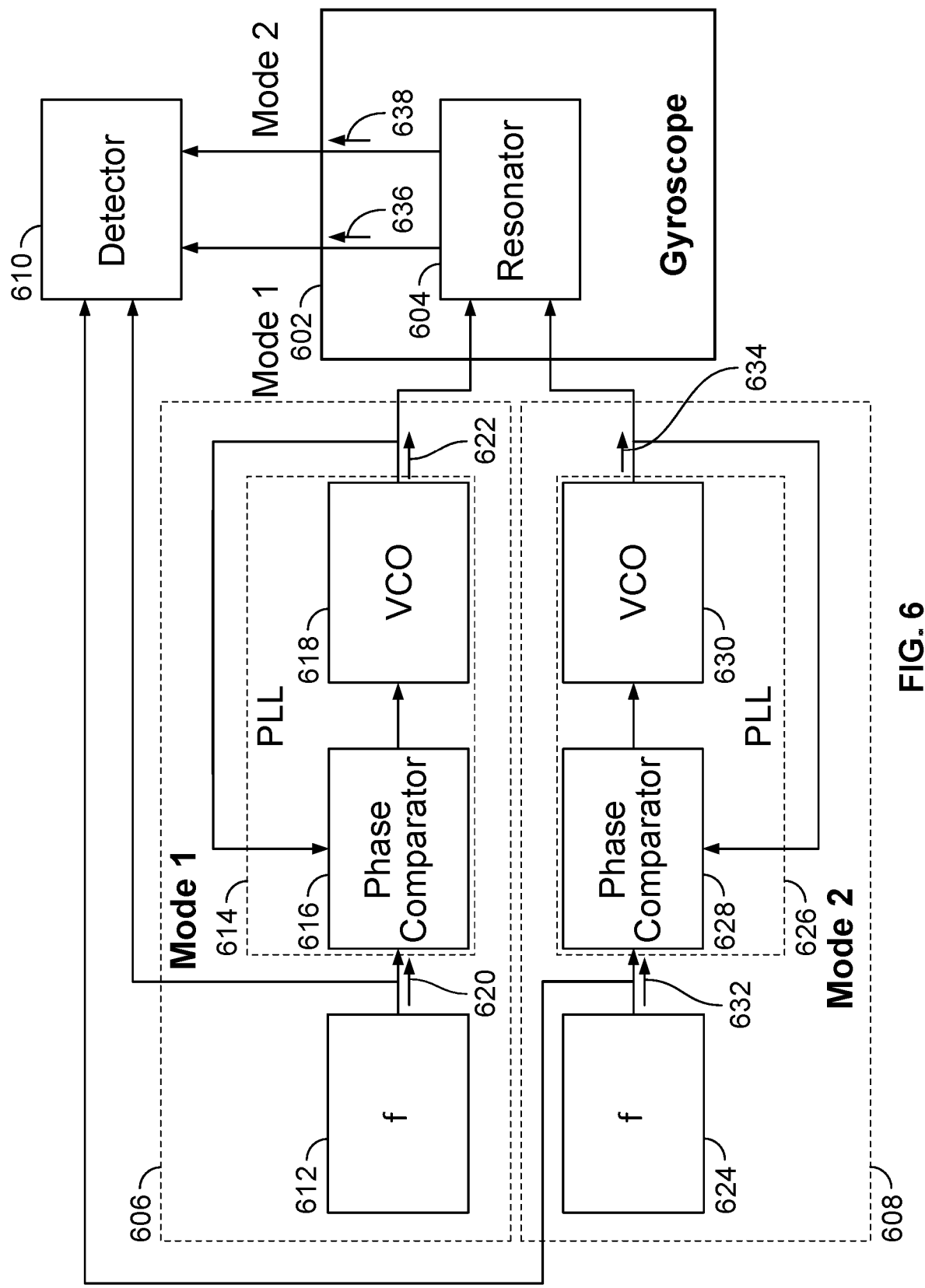
FIG. 6 illustrates a system for determining the minimum ARW for a gyroscope in accordance with aspects of the present disclosure.

FIG. 6 illustrates a system for determining the minimum ARW for a gyroscope in accordance with aspects of the present disclosure. FIG. 6 includes a gyroscope 602, a dual mode resonator 604, a mode one (1) driving leg 606, a mode two (2) driving leg 608 and a detector 610.

In this example, gyroscope 602, dual mode resonator 604, mode one (1) driving leg 606, mode two (2) driving leg 608 and detector 610 are illustrated as individual devices. However, in some embodiments, at least two of gyroscope 602, dual mode resonator 604, mode one (1) driving leg 606, mode two (2) driving leg 608 and detector 610 may be combined as a unitary device. Further, in some embodiments, at least one of gyroscope 602, dual mode resonator 604, mode one (1) driving leg 606, mode two (2) driving leg 608 and detector 610 may be implemented as a computer having tangible computer-readable media for carrying or having computer-executable instructions or data structures stored thereon. Such tangible computer-readable media can be any available media that can be accessed by a general purpose or special purpose computer. Non-limiting examples of tangible computer-readable media include physical storage and/or memory media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. For information transferred or provided over a network or another communications connection (either hardwired, wireless, or a combination of hardwired or wireless) to a computer, the computer may properly view the connection as a computer-readable medium. Thus, any such connection may be properly termed a computer-readable medium. Combinations of the above should also be included within the scope of computer-readable media.

Example tangible computer-readable media may be coupled to a processor such that the processor may read information from, and write information to the tangible computer-readable media. In the alternative, the tangible computer-readable media may be integral to the processor. The processor and the tangible computer-readable media may reside in an application specific integrated circuit ("ASIC"). In the alternative, the processor and the tangible computer-readable media may reside as discrete components.

Mode one (1) driving leg 606 includes a phase setting component 612 and a PLL 614.

In this example, phase setting component 612 and PLL 614 are illustrated as individual devices. However, in some embodiments, phase setting component 612 and PLL 614 may be combined as a unitary device. Further, in some embodiments, at least one of phase setting component 612 and PLL 614 may be implemented as a computer having tangible computer-readable media for carrying or having computer-executable instructions or data structures stored thereon.

PLL 614 includes a phase comparator 616 and a voltage controlled oscillator (VCO) 618. Phase setting component 612 is operable to set a phase indicated by arrow 620 for PLL 614.

In this example, phase comparator 616 and VCO 618 are illustrated as individual devices. However, in some embodiments, phase comparator 616 and VCO 618 may be combined as a unitary device. Further, in some embodiments, at least one of phase comparator 616 and VCO 618 may be implemented as a computer having tangible computer-readable media for carrying or having computer-executable instructions or data structures stored thereon.

PLL 614 is operable to generate an output signal, whose phase is related to the phase of its input signal. In particular, a mode one (1) driving signal 622 output by VCO 618 is fed back to phase comparator 616. Phase comparator 616 compares the phase of mode one (1) driving signal 622 with the phase provided by phase setting component 612 to tune the frequency of mode one (1) driving signal 622.

Mode two (2) driving leg 608 includes a phase setting component 624 and a PLL 626. In this example, phase setting component 624 and PLL 626 are illustrated as individual devices. However, in some embodiments, phase setting component 624 and PLL 626 may be combined as a unitary device. Further, in some embodiments, at least one of phase setting component 624 and PLL 626 may be implemented as a computer having tangible computer-readable media for carrying or having computer-executable instructions or data structures stored thereon.

PLL 626 includes a phase comparator 628 and a VCO 630. Phase setting component 624 is operable to set a phase indicated by arrow 632 for PLL 626.

In this example, phase comparator 628 and VCO 630 are illustrated as individual devices. However, in some embodiments, phase comparator 628 and VCO 630 may be combined as a unitary device. Further, in some embodiments, at least one of phase comparator 628 and VCO 630 may be implemented as a computer having tangible computer-readable media for carrying or having computer-executable instructions or data structures stored thereon.

PLL 626 is operable to generate an output signal, whose phase is related to the phase of its input signal. In particular, mode two (2) driving signal 634 output by VCO 630 is fed back to phase comparator 628. Phase comparator 626 compares the phase of mode two (2) driving signal 634 with the phase provided by phase setting component 624 to tune the frequency of mode two (2) driving signal 634.

Figure 1B:
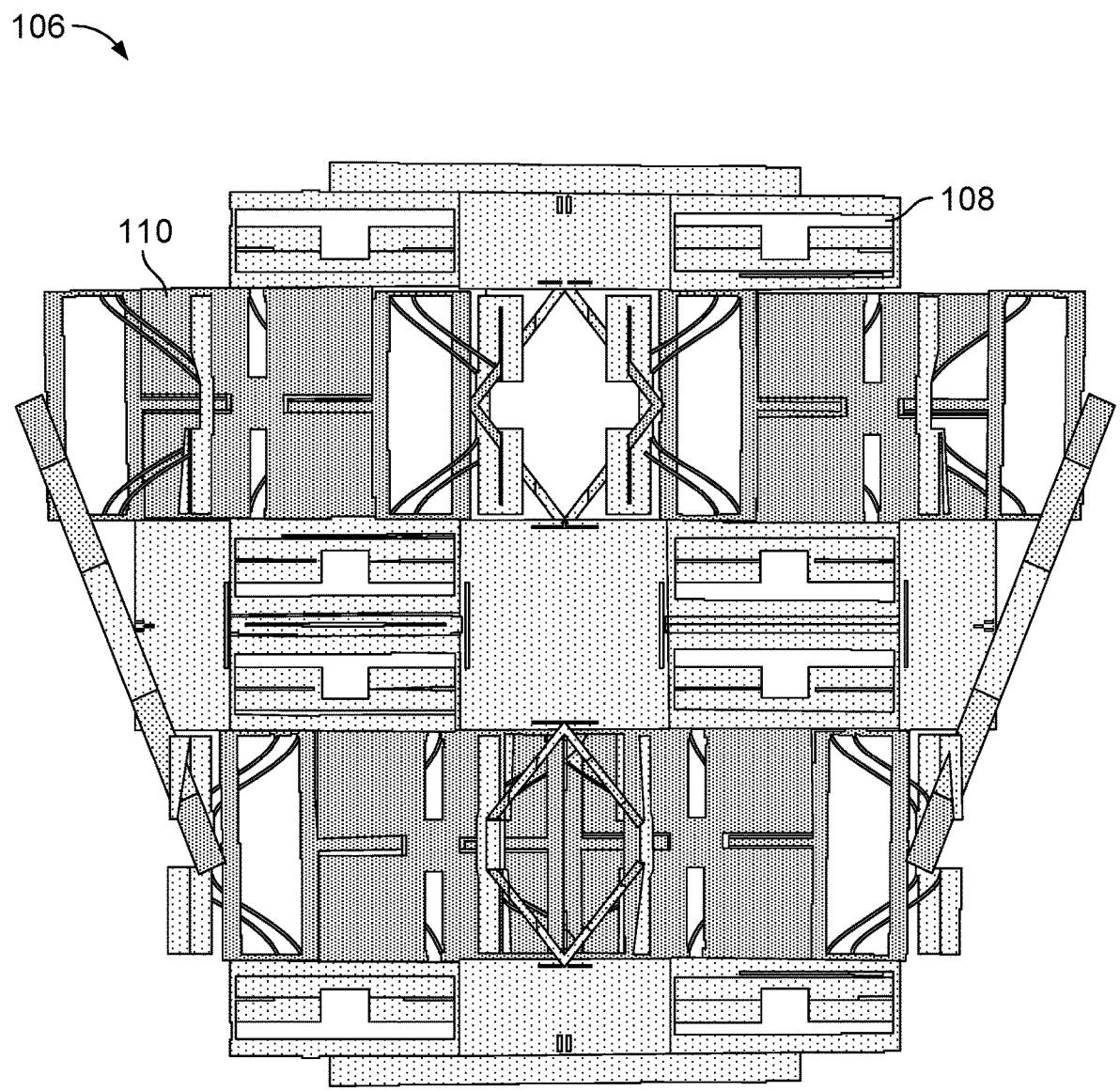
FIG. 1B illustrates a finite element simulation of the other of the anti-phase modes of the dual mode resonator that is used for gyroscope operation.

Mode two (2) driving signal 634 as output by mode two (2) driving leg 608 is operable to drive a second mode of dual mode resonator 604, for example in a manner discussed above with reference to FIG. 1B.

Resonator is operable to resonate in a mode one (1) that is based on mode one (1) driving signal 622 from mode one (1) driving leg 606 and to output a mode one (1) resonation output signal 636 having a mode one (1) frequency that is a function of the phase from phase setting component 612, $f_1(\phi)$, and having a mode one (1) amplitude that is a function of the phase from phase setting component 612, $a_1(\phi)$. Resonator is further operable to resonate in a mode two (2) that is based on mode two (2) driving signal 634 from mode two (2) driving leg 608 and to output a mode two (2) resonation output signal 638 having a mode two (2) frequency that is a function of the phase from phase setting component 624, $f_2(\phi)$, and having a mode two (2) amplitude that is a function of the phase from phase setting component 624, $a_2(\phi)$.

Detector 610 is operable to receive the phase (indicated by arrow) 620 from phase setting component 612, to receive the phase (indicated by arrow) 632 from phase setting component 624, to receive mode one (1) resonation output signal 636 from dual mode resonator 604 and to receive mode two (2) resonation output signal 638 from dual mode resonator 604. Detector 610 is additionally operable to calculate an ARW based on the phase from phase setting component 612, the phase from phase setting component 624, mode one (1) resonator output signal 636 and mode one (1) resonator output signal 638, as will be described in greater detail below.

Figure 7:
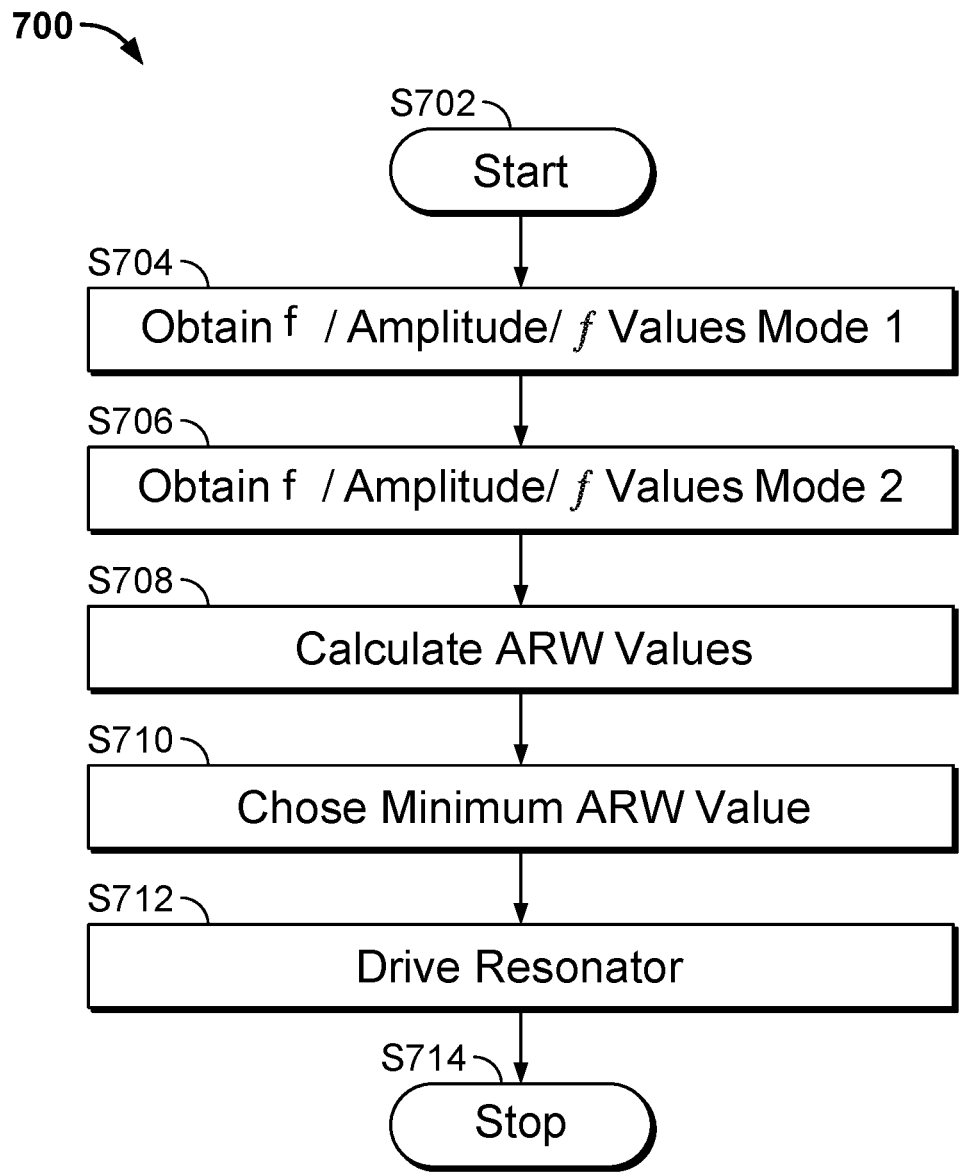
FIG. 7 illustrates a method for determining the minimum ARW for a gyroscope in accordance with aspects of the present disclosure.

FIG. 7 illustrates a method 700 for determining the minimum ARW for a gyroscope in accordance with aspects of the present disclosure. As shown in the figure, method 700 starts (S702) and the phase, amplitude and frequency values for mode one (1) of the gyroscope are obtained (S704). In an example embodiment, a plurality n of mode one (1) measurements are taken over a span of mode one (1) phases $\phi_1$. In some embodiments, the span of phases ranges from 0° through −180°. The plurality of measurements may be taken in incremental phase steps, non-limiting examples of which include steps of 1°, 2°, 5°, 10°. For purposes of discussion, in an example discussed below, the plurality n of mode one (1) measurements are taken in 1° increments from 0° through −180°.

For example, as shown in FIG. 6, phase setting component 612 provides a first mode one (1) phase $\phi_{11}$ to PLL 614 and to detector 610. Based on the first mode one (1) phase $\phi_{11}$, PLL 614 will output mode one (1) driving signal 622 having a frequency, $f_1(\phi_{11})$, which is a function of the first mode one (1) phase $\phi_{11}$. In response to mode one (1) driving signal 622, dual mode resonator 604 will resonate and output mode one (1) resonation output signal 636 having frequency, $f_1(\phi_{11})$. Further, output mode one (1) resonation output signal 636 will have an amplitude, $a_1(\phi_{11})$, which is a function of the first mode one (1) phase $\phi_{11}$, and is related to frequency, $f_1(\phi_{11})$, in a manner as discussed above with reference to FIG. 2.

At this point, detector 610 has information relating the first mode one (1) phase $\phi_{11}$, to the mode one (1) resulting frequency, $f_1(\phi_{11})$, provided by PLL 614 and the mode one (1) amplitude $a_1(\phi_{11})$, elicited from dual mode resonator 604.

This process may be repeated in a stepwise fashion through the range of phases in the predetermined degree steps. As mentioned above, this process is repeated in a one degree (1°) stepwise fashion, 180 times from zero degrees through negative one hundred eighty degrees (0° through −180°). Accordingly, detector obtains information for each $\phi_{1i}$, the mode one (1) resulting frequency, $f_1(\phi_{1i})$, provided by PLL 614 and the respective mode one (1) amplitude $a_1(\phi_{1i})$, wherein i is an integer from 0-180.

After the phase, amplitude and frequency values for mode one (1) of the gyroscope are obtained (S704), the phase, amplitude and frequency values for mode two (2) of the gyroscope are obtained (S706). In an example embodiment, a plurality m of mode two (2) measurements are taken over a span of mode two (2) phases $\phi_2$. In some embodiments, the span of phases ranges from 0° through −180°. The plurality of measurements may be taken in incremental phase steps, non-limiting examples of which include steps of one degree (1°), two degrees (2°), five degrees (5°), and ten degrees (10°). For purposes of discussion, in an example discussed below, the plurality m of mode two (2) measurements are taken in 1° increments from 0° through −180°.

For example, as shown in FIG. 6, phase setting component 624 provides a first mode two (2) phase $\phi_{21}$ to PLL 626 and to detector 610. Based on the first mode one (1) phase $\phi_{21}$, PLL 626 will output mode two (2) driving signal 634 having a frequency, $f_2(\phi_{21})$, which is a function of the first mode two (2) phase $\phi_{21}$. In response to mode two (2) driving signal 634, dual mode resonator 604 will resonate and output mode two (2) resonation output signal 638 having frequency, $f_2(\phi_{21})$. Further, output mode two (2) resonation output signal 638 will have an amplitude, $a_2(\phi_{21})$, which is a function of the first mode two (2) phase $\phi_{21}$, and is related to frequency, $f_2(\phi_{21})$, in a manner as discussed above with reference to FIG. 2.

At this point, detector 610 has information relating the first mode two (2) phase $\phi_{21}$, to the mode two (2) resulting frequency, $f_2(\phi_{21})$, provided by PLL 626 and the mode two (2) amplitude $a_2(\phi_{21})$, elicited from dual mode resonator 604.

This process may be repeated in a stepwise fashion through the range of phases in the predetermined degree steps. As mentioned above, this process is repeated in a 1° stepwise fashion, 180 times from 0° through −180°. Accordingly, detector obtains information for each $\phi_{2j}$, the mode two (2) resulting frequency, $f_2(\phi_{2j})$, provided by PLL 626 and the respective mode two (2) amplitude $a_2(\phi_{2j})$, wherein j is an integer from 0-180.

In this example, the number of samples, n, taken by driving PLL 614 for the first mode of dual mode resonator 604 with n different phases, is equal the number of samples, m, taken by driving PLL 626 for the second mode of dual mode resonator 604 with m different phases, i.e., n=m. However, it should be noted that a method in accordance with aspects of the present disclosure are not limited to taking an equal number of samples from each mode of dual mode resonator 604. In particular, a method in accordance with aspects of the present disclosure includes examples wherein the number of samples, n, taken by driving PLL 614 for the first mode of dual mode resonator 604 with n different phases, is not equal the number of samples, m, taken by driving PLL 626 for the second mode of dual mode resonator 604 with m different phases, m, i.e., n≠m.

After the phase, amplitude and frequency values for mode two (2) of the gyroscope are obtained (S706), the ARW values are calculated (S708). In an example embodiment, detector 610 calculates the ARW values using equation 1 discussed above.

For example, as shown in FIG. 6, detector 610 calculates an $ARW_{ij}$ for each set of input phase $\phi_{1i}$ from phase setting component 612 and input phase $\phi_{2j}$ from phase setting component 624. This will be described with reference to FIG. 8A.

FIG. 8A illustrates a table 800 of Δf and ARW for each phase for the first and second modes of dual mode resonator 604 that is used for the operation of gyroscope 602. As shown in the figure, table 800 includes n rows 802 associated with incrementally stepped phase inputs from phase setting component 612 for mode one (1) of dual mode resonator 604, and m columns 804 associated with incrementally stepped phase inputs from phase setting component 624 for mode two (2) of dual mode resonator 604. The intersecting values, a sample of which is indicated as value 806, corresponds to the Δf and the AWR for the corresponding incrementally stepped phase inputs.

In particular, the Δf is the difference between the driving frequency of mode one (1) driving signal 622 from VCO 618 resulting from PLL 614 being driven by the phase input in the row and the driving frequency of mode two (2) driving signal 634 from VCO 630 resulting from PLL 626 being driven by the phase input in the column.

The AWR is the calculated AWR from equation 1 using the values associated with the incrementally stepped phase inputs from phase setting component 612 for mode one (1) of dual mode resonator 604, and with the incrementally stepped phase inputs from phase setting component 624 for mode two (2) of dual mode resonator 604.

Figure 8B:
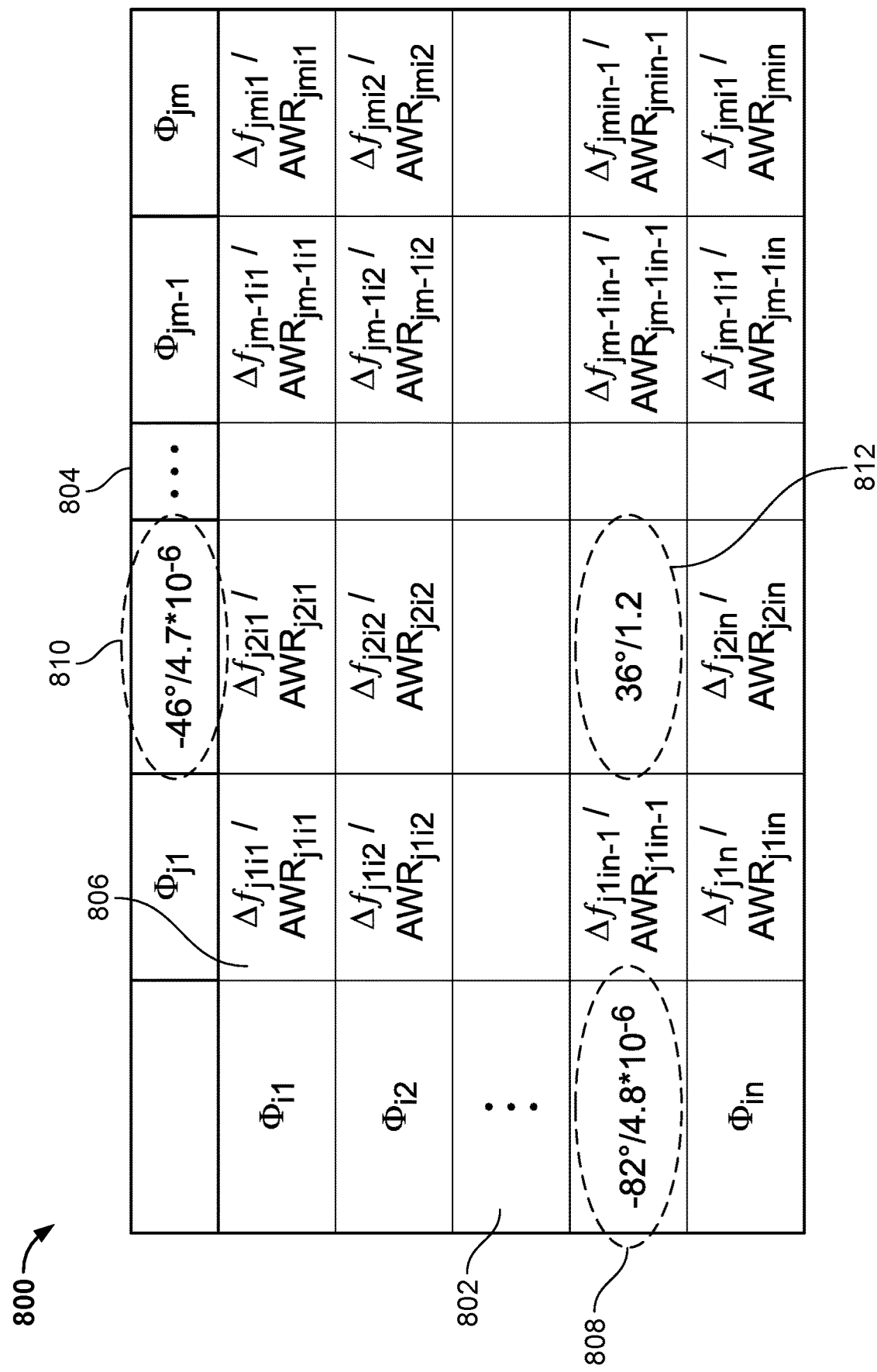
FIG. 8B illustrates the table of FIG. 8A, with some example values.

FIG. 8B illustrates table 800 of FIG. 8A, with some example values. As shown in FIG. 8B, row 808 corresponds to a phase input from phase setting component 612 for mode one (1) of dual mode resonator 604 of negative eighty-two degrees (−82°), which elicits a PSD $4.8 \times 10^{-6}$ $Hz^{-1/2}$. In particular, when phase setting component 612 sets the input phase to −82° for PLL 614, that information is additionally passed to detector 610. PLL 614 will generate mode one (1) driving signal 622 having a mode one (1) driving frequency $f_1$ that is a function of the input phase of −82°. Further, mode one (1) driving frequency $f_1$ based input phase to −82° for PLL 614 will have a resulting PSD, for example as discussed above with reference to FIG. 3. In this example, for purposes of discussion, the PSD is $4.8 \times 10^{-6}$ $Hz^{1/2}$.

Returning to FIG. 8B, column 810 corresponds to a phase input from phase setting component 624 for mode two (2) of dual mode resonator 604 of negative forty-six degrees (−46°), which elicits a PSD $4.7 \times 10^{-6}$ $Hz^{-1/2}$. In particular, when phase setting component 624 sets the input phase to −46° for PLL 626, that information is additionally passed to detector 610. PLL 626 will generate mode two (2) driving signal 634 having a mode two (2) driving frequency $f_2$ that is a function of the input phase of −46°. Further, mode two (2) driving frequency $f_2$ based input phase to −46° for PLL 626 will have a resulting PSD, for example as discussed above with reference to FIG. 3. In this example, for purposes of discussion, the PSD is $4.7 \times 10^{-6}$ $Hz^{1/2}$.

Intersecting value 812 corresponds to the Δf and ARW as calculated by equation 1, using the values of row 808 and column 810. In this example, for purposes of discussion, $\Delta f$ is thirty-six degrees (36°) which is the absolute value of the difference between the mode one (1) driving frequency and the mode two (2) driving frequency, i.e., $|f_1-f_2|$. ARW is calculated using equation 1, wherein $a_1$ is the amplitude of resonator as detected by detector 610 resulting from mode one (1) driving signal 622, wherein $a_2$ is the amplitude of resonator as detected by detector 610 resulting from mode two (2) driving signal 634, $A_g$ is a known value of the angular gain of dual mode resonator 604, $P_1(\Delta f)$ is the PSD of the mode one (1) driving frequency at $|f_1-f_2|$ and $P_2(\Delta f)$ is the PSD of the mode two (2) driving frequency at $|f_1-f_2|$. In this example, the ARW is 1.2 deg/sec/Hz$^{1/2}$.

This process is repeated for all pairs of mode one (1) driving signals and mode two (2) driving signals as the input phase for mode one (1) is incrementally swept through its range and as the input phase for mode two (2) is incrementally swept through its range until the entire table 800 is complete.

For example, $k_{ij}$ ARW values of the dual mode resonator may be determined wherein k=n×m. These ARW values may be calculated using the following equation, $$ARW_{ij}\left(\frac{deg/\sec}{\sqrt{Hz}}\right) = 360 \frac{\sqrt{P_{1i}(\Delta f_{ij})\frac{f_s}{2} + P_{2j}(\Delta f_{ij})\frac{f_s}{2}}}{\frac{1}{2}A_g\left(\frac{a_{1i}}{a_{2j}} + \frac{a_{2j}}{a_{1i}}\right)},$$

wherein $a_{1i}$ is an $i^{th}$ increment of the mode one (1) amplitude of dual mode resonator 604 based on PLL 614 set at the $i^{th}$ mode one (1) phase, wherein $a_{2j}$ is a $j^{th}$ increment of the mode two (2) amplitude of dual mode resonator 604 based on PLL 626 set at the $j^{th}$ mode two (2) phase, wherein $f_{1i}$ is an $i^{th}$ increment of the mode one (1) frequency of dual mode resonator 604 based on PLL 614 set at the $i^{th}$ mode one (1) phase, wherein $f_{2j}$ is a $j^{th}$ increment of the mode two (2) frequency of dual mode resonator 604 based on PLL 626 set at the $j^{th}$ mode two (2) phase, wherein $\Delta f_{ij}=|f_{1i}-f_{2j}|$, wherein $P_{1i}(\Delta f_{ij})$ is a $k^{th}$ PSD value of the mode one (1) frequency of dual mode resonator 604 based on PLL 614 set at the $i^{th}$ mode one (1) phase as demodulated at $\Delta f_{ij}$, and wherein $P_{2j}(\Delta f_{ij})$ is a $k^{th}$ PSD value of the mode two (2) frequency of dual mode resonator 604 based on PLL 626 set at the $j^{th}$ mode two (2) phase as demodulated at $\Delta f_{ij}$.

After the ARW values are calculated (S708), phase values associated with the minimum ARW value are chosen (S710). In an example embodiment, detector 610 choses the minimum ARW value.

Figure 8C:
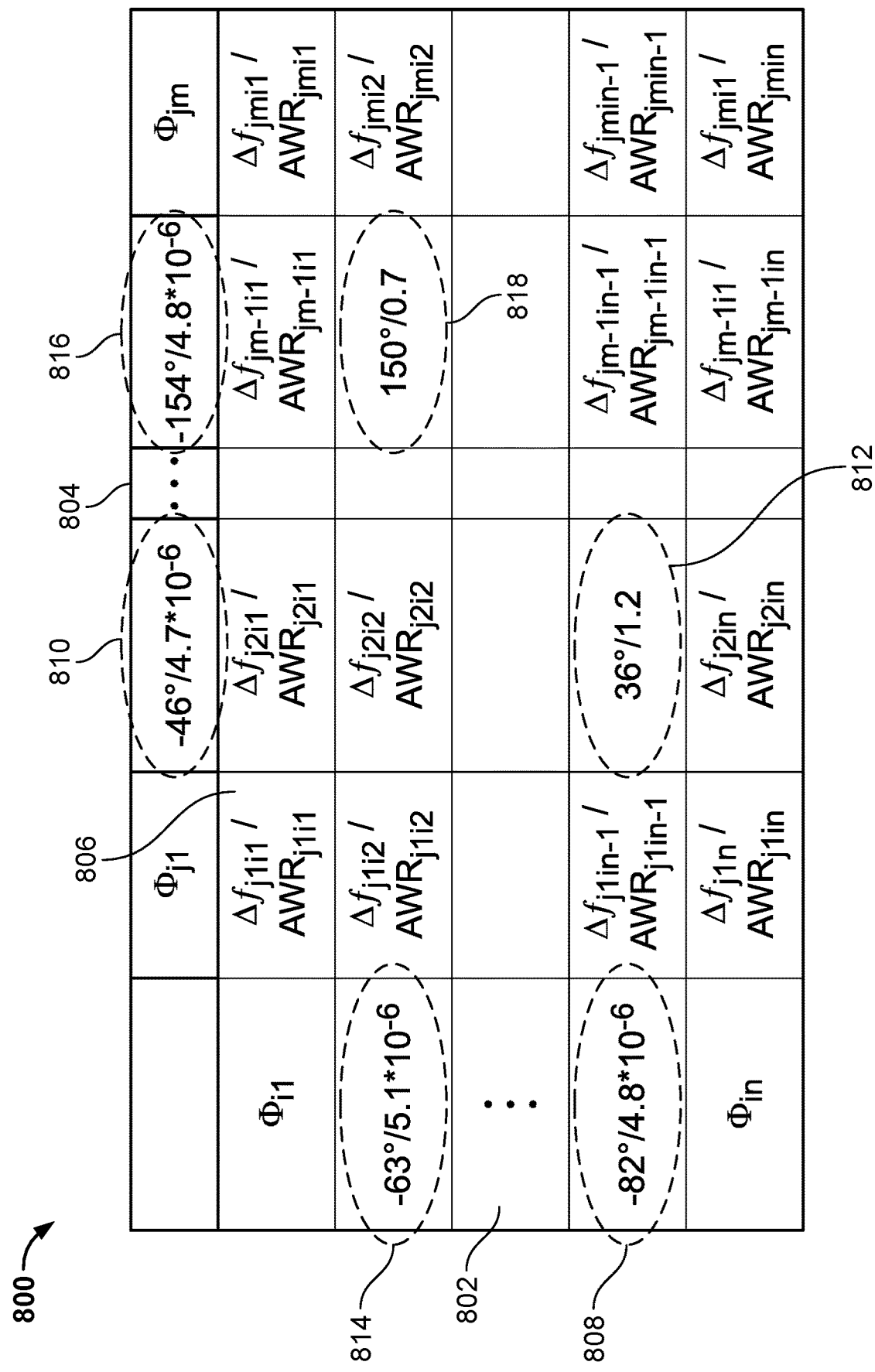
FIG. 8C illustrates the table of FIG. 8B, with some example values in accordance with aspects of the present disclosure.

FIG. 8C illustrates table 800 of FIG. 8B, with some example values in accordance with aspects of the present disclosure. As shown in FIG. 8C, row 814 corresponds to a phase input from phase setting component 612 for mode one (1) of dual mode resonator 604 of negative sixty-three degrees (−63°), which elicits a PSD 5.1×10$^{-6}$ Hz$^{-1/2}$. In particular, when phase setting component 612 sets the input phase to −63° for PLL 614, that information is additionally passed to detector 610. PLL 614 will generate mode one (1) driving signal 622 having a mode one (1) driving frequency $f_1$ that is a function of the input phase of −63°. Further, mode one (1) driving frequency $f_1$ based input phase to −63° for PLL 614 will have a resulting PSD, for example as discussed above with reference to FIG. 3. In this example, for purposes of discussion, the PSD is 5.1×10$^{-6}$ Hz$^{1/2}$.

Returning to FIG. 8C, column 816 corresponds to a phase input from phase setting component 624 for mode two (2) of dual mode resonator 604 of negative one hundred fifty-four degrees (−154°), which elicits a PSD 4.8×10$^{-6}$ Hz$^{-1/2}$. In particular, when phase setting component 624 sets the input phase to −154° for PLL 626, that information is additionally passed to detector 610. PLL 626 will generate mode two (2) driving signal 634 having a mode two (2) driving frequency $f_2$ that is a function of the input phase of −154°. Further, mode two (2) driving frequency $f_2$ based input phase to −154° for PLL 626 will have a resulting PSD, for example as discussed above with reference to FIG. 3. In this example, for purposes of discussion, the PSD is 4.8×10$^{-6}$ Hz$^{1/2}$.

Returning to FIG. 8C, intersecting value 818 corresponds to the $\Delta f$ and ARW as calculated by equation 1, using the values of row 814 and column 816. In this example, for purposes of discussion, $\Delta f$ is one hundred fifty degrees (150°) which is the absolute value of the difference between the mode one (1) driving frequency and the mode two (2) driving frequency, i.e., $|f_1-f_2|$. ARW is calculated using equation 1, wherein $a_1$ is the amplitude of resonator as detected by detector 610 resulting from mode one (1) driving signal 622, wherein $a_2$ is the amplitude of resonator as detected by detector 610 resulting from mode two (2) driving signal 634, $A_g$ is a known value of the angular gain of dual mode resonator 604, $P_1(\Delta f)$ is the PSD of the mode one (1) driving frequency at $|f_1-f_2|$ and $P_2(\Delta f)$ is the PSD of the mode two (2) driving frequency at $|f_1-f_2|$. In this example, the ARW is seven tenths (0.7) deg/sec/Hz$^{1/2}$.

In this example, let intersecting value 818 have the minimum ARW. Accordingly, detector 610 will choose the input phase of −63° for mode one (1) and the input phase of −154° for mode two (2). By driving dual mode resonator 604 with a mode one (1) input phase of −63° and a mode two (2) input phase of −154°, the ARW will be minimized.

It should be noted, one conventional method for choosing input phases for driving a dual mode resonator includes choosing input phases for each mode that have the lowest PSD. As shown in the example above, in FIG. 8C, the input phase for row 808 has a PSD of 4.8×10$^{-6}$ Hz$^{1/2}$, which is lower than the input phase for row 814 that has a PSD of 5.1×10$^{-6}$ Hz$^{1/2}$. Further, the input phase for column 810 has a PSD of 4.7×10$^{-6}$ Hz$^{1/2}$, which is lower than the input phase for column 816 that has a PSD of 4.8×10$^{-6}$ Hz$^{1/2}$.

Accordingly, a conventional method might choose the input phase of −82° for mode one (1) and the input phase of −46° for mode two (2). By driving dual mode resonator 604 with a mode one (1) input phase of −82° and a mode two (2) input phase of −46°, the ARW will be 1.2 deg/sec/Hz$^{1/2}$, but will not be minimized.

However, as shown, intersecting value 818 has a ARW of 0.7 deg/sec/Hz$^{1/2}$, which is lower than the ARW of intersecting value 812, which is one and two tenths (1.2) deg/sec/Hz$^{1/2}$. In particular, as discussed above with reference to equation 1, in accordance with aspects of the present disclosure, $\Delta f$—the difference of the driving frequencies of the modes, and the difference in the amplitudes of the modes are also taken into consideration to determine the minimum ARW.

After the phase values associated with the minimum ARW value are chosen (S710), the dual mode resonator is driven (S712) and method 700 stops (S714).

In a working example, based on the results of FIG. 5 and the noted caveats, a frequency split of one hundred fifty (150) Hz was selected. A contour diagram of the model-predicted ARW for a 150 Hz frequency split for the case that both modes are excited at four (4) mV is shown in FIG. 9.

Figure 9:
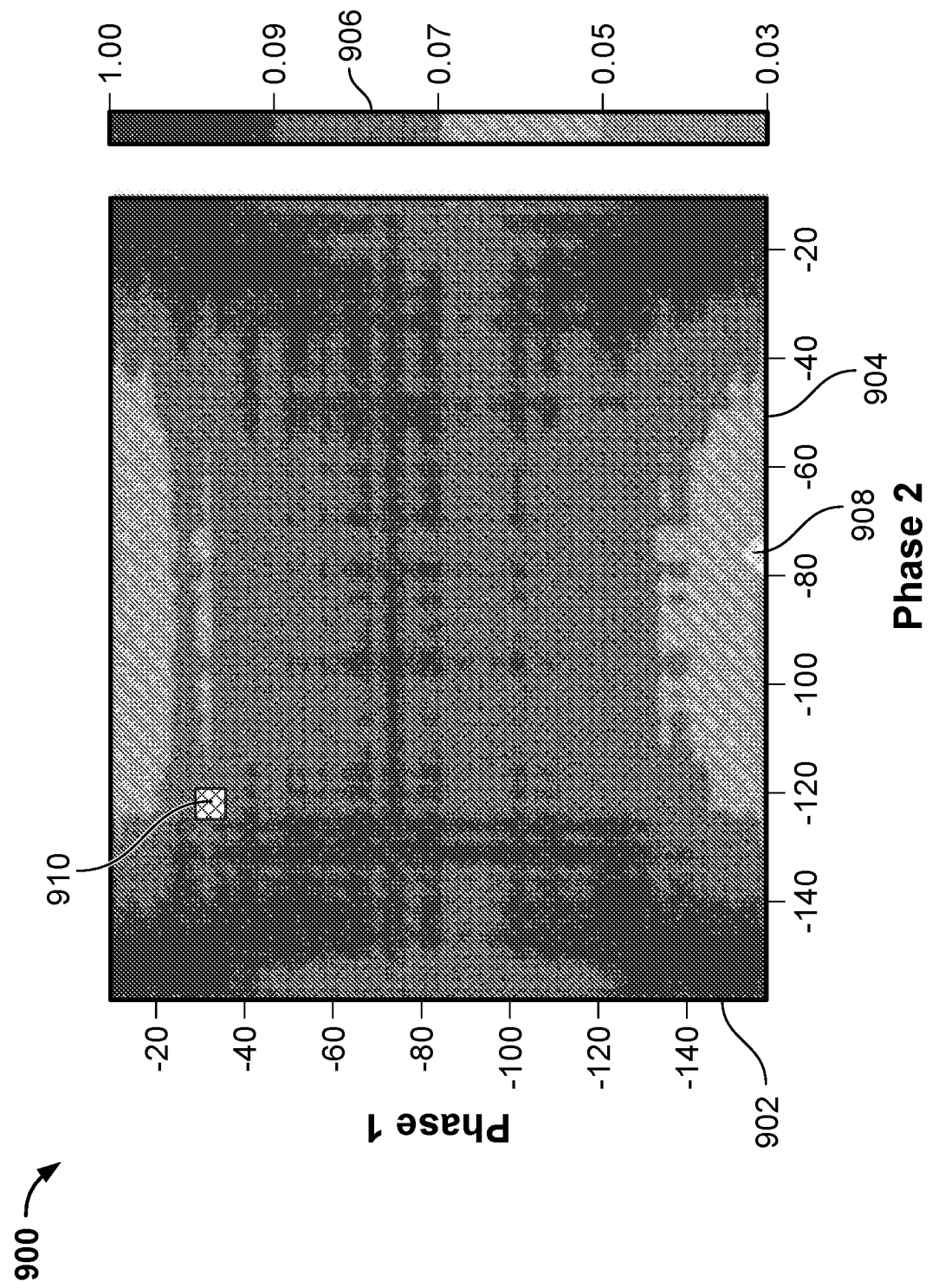
FIG. 9 illustrates a contour diagram of model-predicted ARW.

FIG. 9 illustrates a contour diagram 900 of model-predicted ARW. As shown in the figure, contour diagram 900 includes a y-axis 902, an x-axis 904 and a key 906. Y-axis 902 is the phase of the first mode in degrees, whereas x-axis 904 is the phase of the second mode in degrees. Key 906 has a range from three hundredths (0.03) deg/sec/Hz$^{1/2}$ negative one (−1.0) deg/sec/Hz$^{1/2}$.

The minimum value of contour diagram 900 can then be used to find conditions that minimize ARW. Triangle 908 at thirty-nine thousandths (0.039) deg/sec/Hz$^{1/2}$ corresponds to this minimum. In other words, after contour diagram 900 is created and the minimum ARW is determined, which in this case is at the position of diamond 908, then those phases may be chosen for the respective PLLs for the sustaining circuits of the respective modes.

To provide a contrast to using contour diagram 900 to select operating conditions that ignore the ARW model, a cross 910 shows the phase states that minimize the frequency fluctuations at the selected frequency split. The ARW value for the minimum frequency fluctuation case is sixty-six thousandths (0.066) deg/sec/Hz. In other words, by not using contour diagram 900 created in accordance with aspects of the present disclosure, one might choose the phases for the respective PLLs for the sustaining circuits of the respective modes as indicated by cross 910. In this case, the ARW of associated with the phases at cross 910 is much higher than the ARW associated with triangle 908. Accordingly, by using a method in accordance with the present disclosure, minimization of ARW is improved.

To validate both the model and the ARW minimization method, conditions for ARW minimization and minimum frequency fluctuations were used to implement an FM gyroscope.

Utilizing the results discussed above, different phase feedback values were selected to implement an FM gyroscope. Electrostatic tuning was used to adjust the frequency split to be close to one hundred fifty (150) Hz. As the minimum ARW case was tested first and the frequency split was not actively controlled, the frequency split drifted from one hundred forty-six (146) Hz during the minimum ARW tests to one hundred thirty-nine (139) Hz during the minimum frequency fluctuations tests. A simple three point calibration at zero (0), two (2), and ten (10) deg/sec was used to estimate the scale factor during both trials.

To summarize a method of minimizing ARW in accordance with the present disclosure consider the following. In equation 1, $P_1(\Delta f)$ is the PSD of the first mode of the frequency split, e.g., $|f_1-f_2|$. The sampling frequency, $f_s$, is present in equation 1 because PSD is a measurement of noise as a function of a given frequency. If integrated over all frequency values, the PSD is actually related to variance. Accordingly, the PSD is a frequency representation of variance. Therefore, the sampling rate is sort of a scaling factor to account for the lack of integration over all frequency values. The angular gain, $A_g$, is given and is based on the geometry of the device.

In prior art systems, $a_1$ was set equal to $a_2$. The present disclosure explores what happens if $a_1$ does not equal $a_2$. Therefore, in accordance with aspects of the present disclosure, ARW may be minimized when $a_1$ does not equal $a_2$.

Returning to equation 1, to minimize ARW, the numerator must be as small as possible and/or the denominator should be as large as possible. To decrease the numerator, which the PSD should be minimized. However, the challenge with that tactic is that the conventional thought was that to minimize ARW, the amplitude of the device needs to be increased. If that is done, as shown in FIG. 3, the PSD value is changed. However, these are conflicting effects. For example, consider the situation that ARW is decreased by increasing the value of the denominator of equation 1. This can be accomplished by making $a_1$ much different than $a_2$. However, if $a_1$ much different from $a_2$, there will be a compromise with an increased PSD. So these are competing effects.

So with respect to the method of the present disclosure, amplitude and PSD values are determined for a first mode of a resonator, for example as discussed above with reference to FIGS. 2-3. Then amplitude and PSD values are determined for the second mode of the dual mode resonator. With the obtained measurements for amplitude and PSD values for both modes, those measurements are plugged into equation 1. The values from equation 1 are used to generate a model-predicted ARW, for example as shown in FIG. 5, where the output would be the minimum value that the model would predict for a given frequency split value. Then, a frequency split, $\Delta f$, would be chosen, that provides an acceptable ARW. For example, in the example discussed above, one hundred fifty (150) Hz was chosen. At this point, equation 1 would be revisited using the previous amplitude and PSD values of the two modes and using the chosen $\Delta f$ from the model-predicted ARW to generate a contour diagram as discussed above with reference of FIG. 9. From the generated contour diagram, the phases may be chosen to drive PLLs for the sustaining circuits to achieve the minimum ARW.

Figure 10:
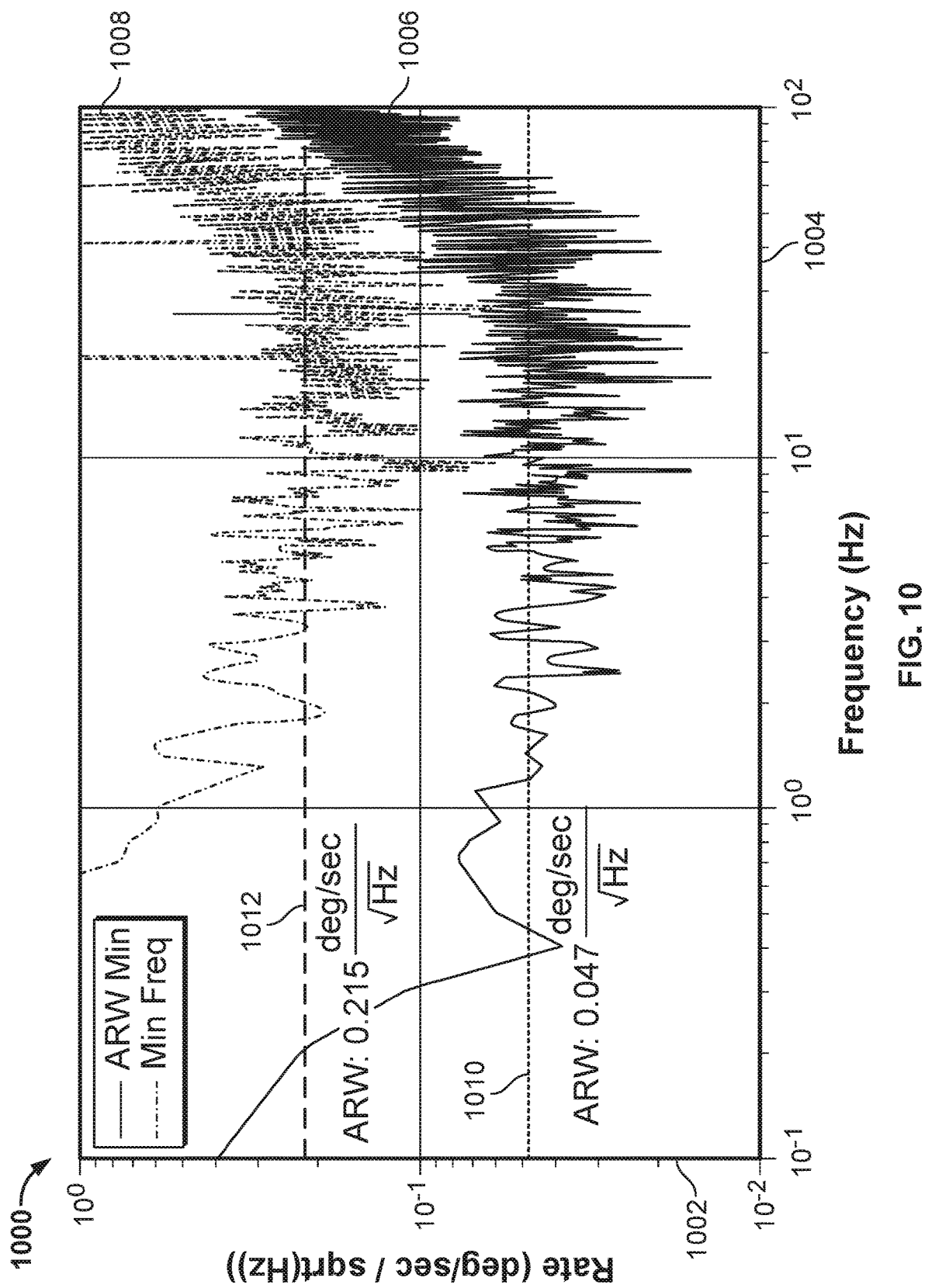
FIG. 10 illustrates a graph of measured rate PSDs for minimum ARW and minimum frequency fluctuations tests.

The PSDs of the calibrated rate outputs are shown in FIG. 10. FIG. 10 illustrates a graph 1000 of measured rate PSDs for minimum ARW and minimum frequency fluctuations tests. As shown in the figure, graph 1000 includes a y-axis 1002, an x-axis 404, a function 1006, a function 1008, a line 1010 and a line 1012. Y-axis 1002 is the ARW measured in degrees/second/Hz$^{1/2}$, whereas x-axis 1004 is frequency in Hz.

Function 1006 is the PSD of the calibrated rate output for the ARW minimized case in accordance with the present disclosure. Line 1010 corresponds to a measure ARW of forty-seven thousandths (0.047) deg/sec/Hz$^{1/2}$. Function 1008 is the PSD of the calibrated rate output for the minimum frequency fluctuation case. Line 1010 corresponds to a measure ARW of two hundred fifteen thousandths (0.215) deg/sec/Hz$^{1/2}$.

For the ARW minimized case, as indicated by function 1006, the model very closely predicts the measured ARW of 0.047 deg/sec/Hz at line 1010. The model, however, is less accurate for the minimum frequency fluctuations case, as indicated by function 1008, where the measured ARW was 0.215 deg/sec Hz at line 1012. This is believed to be due to errors associated with calibration as the residual of the linear fit used to estimate the scale factor is relatively large. With more accurate calibration, it is expected that the model and measured values of ARW will much more closely agree.

A notable limitation with FM gyroscopes, compared to their AM counterparts, is relatively worse short-term stability. It has been shown in past and in the present disclosure that operating the modes of an FM gyroscope with different amplitudes can be used to enhance sensitivity and thus improve short-term stability. However, decreasing the amplitude of an oscillator typically decreases frequency stability. To account for the competing effects associated with altering amplitude, the present disclosure provides an ARW minimization method. Given the challenges associated with modeling the amplitude and frequency stability of resonators operating in nonlinear regimes, empirical methods based on closed-loop frequency response measurements were used. In conjunction with a model, the data from these measurements were used to predict ARW. The model-predicted conditions were used to implement a FM gyroscope.

As the measured and predicted values of ARW were close, this provides validation of the presented method.

In accordance with the present disclosure, a PLL was used to sustain oscillations. While this aids in the rejection of high-frequency noise, current work on the use of analog electronics to sustain oscillations shows that frequency stability is optimized within the regime that the presented ARW model is valid. This will be described with reference to FIG. 11.

Figure 11:
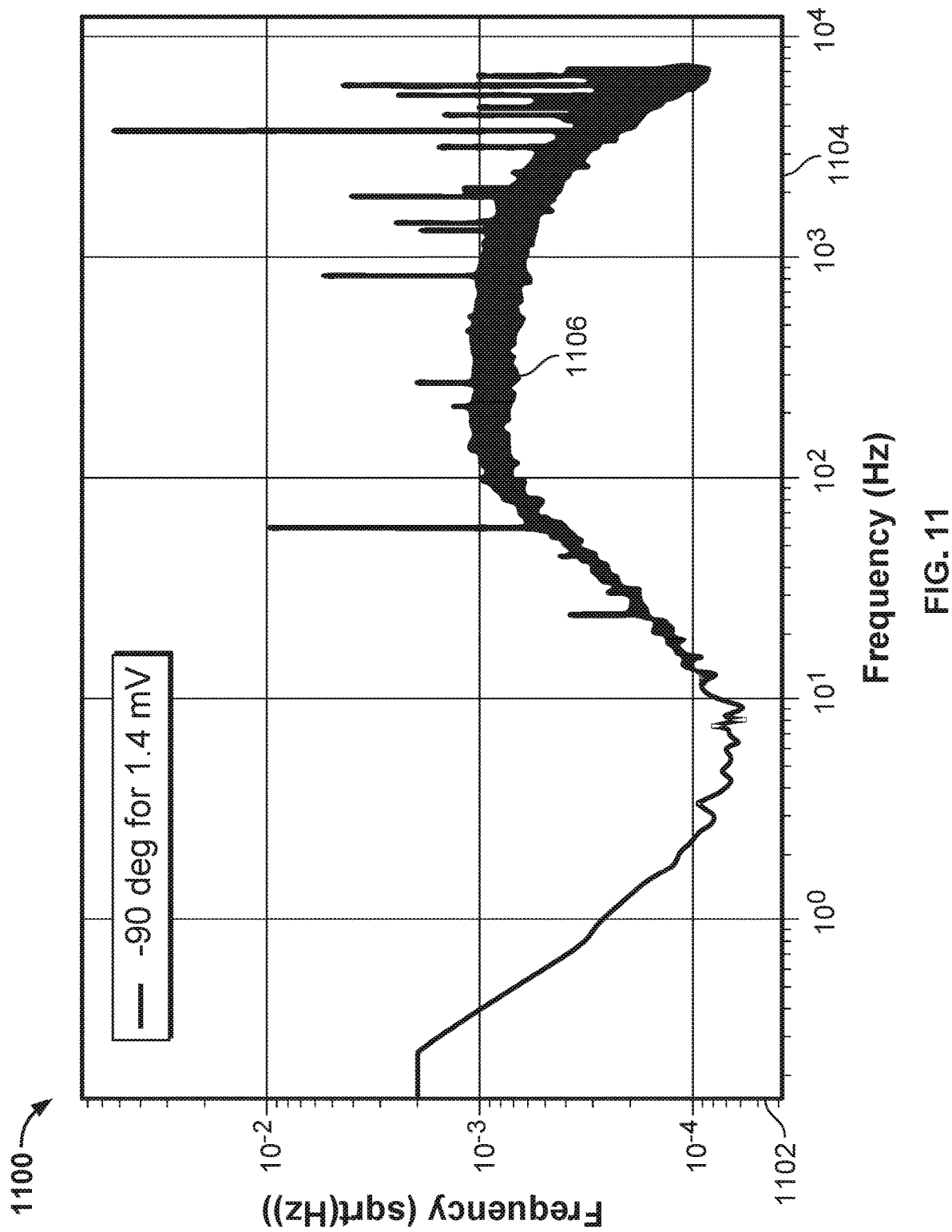
FIG. 11 illustrates a graph of preliminary frequency fluctuation data with analog electronics used to sustain oscillations.

FIG. 11 illustrates a graph 1100 of preliminary frequency fluctuation data with analog electronics used to sustain oscillations. As shown in the figure, graph 1100 includes a y-axis 1102, an x-axis 1104 and a function 1106. Y-axis 1102 is the frequency measured in $Hz^{1/2}$, whereas x-axis 1104 is frequency in Hz.

As shown in graph 1100, relative to conventional frequency modulated dual mode gyroscope driving methods, in accordance with aspects of the present disclosure, the frequency split is much higher. For example, the conventional belief is that large frequency splits are not advantageous. However, in accordance with the present disclosure, with PLLs driving the dual mode resonator enable a relatively high frequency split, on the order of approximately one hundred to one hundred fifty (100-150) Hz, without having decreased performance. As shown in graph 1100, the PSD at 100 Hz is only around $10^{-3}$ Hz.

In some embodiments the dual mode resonator may be a miniature structure that is vacuum packaged to remove damping effects due to atmospheric pressure. This structure ideally has two degenerate modes, or orthogonal vibrational patterns with identical natural frequencies. In practice, fabrication imperfections cause both modes to have distinct natural frequencies and quadrature error, or unintended mechanical coupling, which can be significant (i.e. the error signal produced by quadrature error is often greater than the one from rotation). As explained above, with the nonlinear FM gyroscope, some frequency difference between the two modes is needed as the rate signal is encoded as a frequency modulation at the frequency of the frequency difference.

The non-limiting example dual mode resonator described above is a quadruple mass gyroscope with internal levers that is designed to fit a 2×2 mm silicon die. Other embodiments may remove the internal levers and add electrodes for quadrature tuning. Other common structures may be ring or disk shaped. Both larger and smaller variants of the dual mode resonator and different materials (e.g. quartz or metal) may also be used in accordance with the present disclosure. In some embodiments, electrostatic systems may be used to excite and sense the motion of the resonator. However, in other embodiments piezoelectric and magnetic systems may both be used. Still further, hybrid methods that combine one method with another can be used and optical methods based on Doppler shifts or Fabry-Perot interferometry can be used to mitigate certain effects associated with electronic amplifier noise.

It should be noted that a feedback controller may be used to detect the output signals produced by the dual mode resonator and manipulate them such that they can be utilized as input signals to the resonator to sustain oscillations. In the above discussed embodiments, a digital PLL was utilized as it was able to maintain a set phase relationship between the input and output of the resonator. The set phase value was selected to optimize frequency stability while the resonator is operating in a nonlinear regime. Other feedback controllers such as an analog PLL or analog positive feedback may also be used in accordance with the present disclosure. The feedback controller can also be implemented to maintain a particular frequency difference or remove quadrature error.

In the example embodiments discussed above, estimates of the rate and quadrature signals are provided by summing the demodulated frequencies of both modes of the dual mode resonator and then performing phase-sensitive demodulation. Frequency demodulation was implemented with a digital PLL. However, in other embodiments, methods based on zero-crossing times or Kalman filtering may be used reduce power consumption or improve accuracy, respectively.

The foregoing description of various embodiments has been presented for purposes of illustration and description. It is not intended to be exhaustive or to limit the disclosure to the precise forms disclosed, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto.

What is claimed as new and desired to be protected by Letters Patent of the United States is:

1. A method of determining a driving signal for a dual mode resonator of a gyroscope, said method comprising:
   driving, via a first mode phase-locked loop (PLL) set at first mode phase, a first mode of the dual mode resonator;
   obtaining, via a detector, a first mode power spectral density (PSD) value of the dual mode resonator, a first mode amplitude of the dual mode resonator and a first mode frequency of the dual mode resonator based on the PLL set at the first mode phase;
   repeating said driving the first mode of the dual mode resonator and said obtaining a respective first mode PSD value, a respective first mode amplitude of the dual mode resonator and a respective first mode frequency of the dual mode resonator based on the PLL set at a respective first mode phase a number n times to obtain n respective first mode PSD values of the dual mode resonator, n respective first mode amplitudes of the dual mode resonator and n respective first mode frequencies of the dual mode resonator, each repetition of said driving the first mode of the dual mode resonator and said obtaining a respective first mode PSD value, a respective first mode amplitude of the dual mode resonator and a respective first mode frequency of the dual mode resonator having the first mode PLL being set at a different respective first mode phase;
   driving, via a second mode PLL set at second mode phase, a second mode of the dual mode resonator;
   obtaining, via the detector, a second mode PSD value of the dual mode resonator, a second mode amplitude of the dual mode resonator and a second mode frequency of the dual mode resonator based on the PLL set at the second mode phase;
   repeating said driving the second mode of the dual mode resonator and said obtaining a respective second mode PSD value, a respective second mode amplitude of the dual mode resonator and a respective second mode frequency of the dual mode resonator based on the PLL set at a respective second mode phase a number m times to obtain m respective second mode PSD values of the dual mode resonator, m respective second mode amplitudes of the dual mode resonator and m respective second mode frequencies of the dual mode resonator, each repetition of said driving the second mode of the dual mode resonator and said obtaining a respective second mode PSD value, a respective second mode amplitude of the dual mode resonator and a respective second mode frequency of the dual mode resonator having the second mode PLL being set at a different respective second mode phase;

determining an angle random walk, ARW, value of the dual mode resonator using the following equation, $$ARW\left(\frac{deg/\sec}{\sqrt{Hz}}\right) = 360 \frac{\sqrt{P_1(\Delta f)\frac{f_s}{2} + P_2(\Delta f)\frac{f_s}{2}}}{\frac{1}{2}A_g\left(\frac{a_1}{a_2} + \frac{a_2}{a_1}\right)},$$

wherein $f_s$ is a sampling frequency,
wherein $A_g$ is the angular gain of the dual mode resonator,
wherein $a_1$ is the first mode amplitude of the dual mode resonator based on the PLL set at the first mode phase,
wherein $a_2$ is the second mode amplitude of the dual mode resonator based on the PLL set at the second mode phase,
wherein $f_1$ is the first mode frequency of the dual mode resonator based on the PLL set at the first mode phase,
wherein $f_2$ is the second mode frequency of the dual mode resonator based on the PLL set at the second mode phase,
wherein $\Delta f = |f_1 - f_2|$,
wherein $P_1(\Delta f)$ is a PSD value of the first mode frequency of the dual mode resonator based on the PLL set at the first mode phase as demodulated at $\Delta f$, and
wherein $P_2(\Delta f)$ is a PSD value of the second mode frequency of the dual mode resonator based on the PLL set at the second mode phase as demodulated at $\Delta f$.

2. The method of claim 1, wherein n=m.

3. The method of claim 2, wherein the PLL is set at the respective first mode phase the number n times between 0° and −180°.

4. The method of claim 3, wherein the PLL is set at the respective first mode phase the number n times at increments of at least 1°.

5. The method of claim 4, wherein driving, via a first mode PLL set at first mode phase, a first mode of the dual mode resonator comprises driving the first mode of the dual mode resonator of a quadruple mass gyroscope.

6. The method of claim 5, wherein $\Delta f$ is at least 100 Hz.

7. The method of claim 6, further comprising:
determining $k_{ij}$ ARW values of the dual mode resonator using the following equation, $$ARW_{ij}\left(\frac{deg/\sec}{\sqrt{Hz}}\right) = 360 \frac{\sqrt{P_{1i}(\Delta f_{ij})\frac{f_s}{2} + P_{2j}(\Delta f_{ij})\frac{f_s}{2}}}{\frac{1}{2}A_g\left(\frac{a_{1i}}{a_{2j}} + \frac{a_{2j}}{a_{1i}}\right)},$$

wherein $a_{1i}$ is an $i^{th}$ increment of the first mode amplitude of the dual mode resonator based on the PLL set at the $i^{th}$ first mode phase,
wherein $a_{2j}$ is a $j^{th}$ increment of the second mode amplitude of the dual mode resonator based on the PLL set at the $j^{th}$ second mode phase,
wherein $f_{2j}$ is an $i^{th}$ increment of the first mode frequency of the dual mode resonator based on the PLL set at the $i^{th}$ first mode phase,
wherein $f_{2j}$ is a $j^{th}$ increment of the second mode frequency of the dual mode resonator based on the PLL set at the $j^{th}$ second mode phase,
wherein $\Delta f_{ij} = |f_{1i} - f_{2j}|$,
wherein $P_{1i}(\Delta f_{ij})$ is a $k^{th}$ PSD value of the first mode frequency of the dual mode resonator based on the PLL set at the $i^{th}$ first mode phase as demodulated at $\Delta f_{ij}$, and
wherein $P_{2j}(\Delta f_{ij})$ is a $k^{th}$ PSD value of the second mode frequency of the dual mode resonator based on the PLL set at the $j^{th}$ second mode phase as demodulated at $\Delta f_{ij}$.

8. The method of claim 1, wherein the PLL is set at the respective first mode phase the number n times between 0° and −180°.

9. The method of claim 8, wherein the PLL is set at the respective first mode phase the number n times at increments of at least 1°.

10. The method of claim 9, wherein driving, via a first mode PLL set at first mode phase, a first mode of the dual mode resonator comprises driving the first mode of the dual mode resonator of a quadruple mass gyroscope.

11. The method of claim 10, wherein $\Delta f$ is at least 100 Hz.

12. The method of claim 11, further comprising:
determining $k_{ij}$ ARW values of the dual mode resonator using the following equation, $$ARW_{ij}\left(\frac{deg/\sec}{\sqrt{Hz}}\right) = 360 \frac{\sqrt{P_{1i}(\Delta f_{ij})\frac{f_s}{2} + P_{2j}(\Delta f_{ij})\frac{f_s}{2}}}{\frac{1}{2}A_g\left(\frac{a_{1i}}{a_{2j}} + \frac{a_{2j}}{a_{1i}}\right)},$$

wherein $a_{1i}$ is an $i^{th}$ increment of the first mode amplitude of the dual mode resonator based on the PLL set at the $i^{th}$ first mode phase,
wherein $a_{2j}$ is a $j^{th}$ increment of the second mode amplitude of the dual mode resonator based on the PLL set at the $j^{th}$ second mode phase,
wherein $f_{1i}$ is an $i^{th}$ increment of the first mode frequency of the dual mode resonator based on the PLL set at the $i^{th}$ first mode phase,
wherein $f_{2j}$ is a $j^{th}$ increment of the second mode frequency of the dual mode resonator based on the PLL set at the $j^{th}$ second mode phase,
wherein $\Delta f_{ij} = |f_{1i} - f_{2j}|$,
wherein $P_{1i}(\Delta f_{ij})$ is a $k^{th}$ PSD value of the first mode frequency of the dual mode resonator based on the PLL set at the $i^{th}$ first mode phase as demodulated at $\Delta f_{ij}$, and
wherein $P_{2i}(\Delta f_{ij})$ is a $k^{th}$ PSD value of the second mode frequency of the dual mode resonator based on the PLL set at the $j^{th}$ second mode phase as demodulated at $\Delta f_{ij}$.

13. The method of claim 1, wherein the PLL is set at the respective first mode phase the number n times at increments of at least 1°.

14. The method of claim 13, wherein driving, via a first mode PLL set at first mode phase, a first mode of the dual mode resonator comprises driving the first mode of the dual mode resonator of a quadruple mass gyroscope.

15. The method of claim 14, wherein $\Delta f$ is at least 100 Hz.

16. The method of claim 15, further comprising:

determining $k_{ij}$ ARW values of the dual mode resonator using the following equation, $$ARW_{ij}\left(\frac{deg/\sec}{\sqrt{Hz}}\right) = 360 \frac{\sqrt{P_{1i}(\Delta f_{ij})\frac{f_s}{2} + P_{2j}(\Delta f_{ij})\frac{f_s}{2}}}{\frac{1}{2}A_g\left(\frac{a_{1i}}{a_{2j}} + \frac{a_{2j}}{\alpha_{1i}}\right)},$$

wherein $a_{1i}$ is an $i^{th}$ increment of the first mode amplitude of the dual mode resonator based on the PLL set at the $i^{th}$ first mode phase, wherein $a_{2j}$ is a $j^{th}$ increment of the second mode amplitude of the dual mode resonator based on the PLL set at the $j^{th}$ second mode phase, wherein $f_{1i}$ is an $i^{th}$ increment of the first mode frequency of the dual mode resonator based on the PLL set at the $i^{th}$ first mode phase, wherein $f_{2j}$ is a $j^{th}$ increment of the second mode frequency of the dual mode resonator based on the PLL set at the $j^{th}$ second mode phase, wherein $\Delta f_{ij} = |f_{1i} - f_{2j}|$, wherein $P_{1i}(\Delta f_{ij})$ is a $k^{th}$ PSD value of the first mode frequency of the dual mode resonator based on the PLL set at the $i^{th}$ first mode phase as demodulated at $\Delta f_{ij}$, and wherein $P_{2j}(\Delta f_{ij})$ is a $k^{th}$ PSD value of the second mode frequency of the dual mode resonator based on the PLL set at the $j^{th}$ second mode phase as demodulated at $\Delta f_{ij}$.

17. The method of claim 1, wherein the PLL is set at the respective first mode phase the number n times at increments of at least 1°.

18. The method of claim 17, wherein driving, via a first mode PLL set at first mode phase, a first mode of the dual mode resonator comprises driving the first mode of the dual mode resonator of a quadruple mass gyroscope.

19. A method of determining a driving signal for a dual mode resonator of a gyroscope, said method comprising:

driving, via a first mode phase-locked loop (PLL) set at first mode phase, a first mode of the dual mode resonator;

obtaining, via a detector, a first mode power spectral density (PSD) value of the dual mode resonator, a first mode amplitude of the dual mode resonator and a first mode frequency of the dual mode resonator based on the PLL set at the first mode phase;

repeating said driving the first mode of the dual mode resonator and said obtaining a respective first mode PSD value, a respective first mode amplitude of the dual mode resonator and a respective first mode frequency of the dual mode resonator based on the PLL set at a respective first mode phase a number n times to obtain n respective first mode PSD values of the dual mode resonator, n respective first mode amplitudes of the dual mode resonator and n respective first mode frequencies of the dual mode resonator, each repetition of said driving the first mode of the dual mode resonator and said obtaining a respective first mode PSD value, a respective first mode amplitude of the dual mode resonator and a respective first mode frequency of the dual mode resonator having the first mode PLL being set at a different respective first mode phase;

driving, via a second mode PLL set at second mode phase, a second mode of the dual mode resonator;

obtaining, via the detector, a second mode PSD value of the dual mode resonator, a second mode amplitude of the dual mode resonator and a second mode frequency of the dual mode resonator based on the PLL set at the second mode phase;

repeating said driving the second mode of the dual mode resonator and said obtaining a respective second mode PSD value, a respective second mode amplitude of the dual mode resonator and a respective second mode frequency of the dual mode resonator based on the PLL set at a respective second mode phase a number m times to obtain m respective second mode PSD values of the dual mode resonator, m respective second mode amplitudes of the dual mode resonator and m respective second mode frequencies of the dual mode resonator, each repetition of said driving the second mode of the dual mode resonator and said obtaining a respective second mode PSD value, a respective second mode amplitude of the dual mode resonator and a respective second mode frequency of the dual mode resonator having the second mode PLL being set at a different respective second mode phase;

determining an angle random walk, ARW, value of the dual mode resonator using the following equation, $$ARW\left(\frac{deg/\sec}{\sqrt{Hz}}\right) = 360 \frac{\sqrt{P_1(\Delta f)\frac{f_s}{2} + P_2(\Delta f)\frac{f_s}{2}}}{\frac{1}{2}A_g\left(\frac{a_1}{a_2} + \frac{a_2}{\alpha_1}\right)};$$

and determining $k_{ij}$ ARW values of the dual mode resonator using the following equation, $$ARW_{ij}\left(\frac{deg/\sec}{\sqrt{Hz}}\right) = 360 \frac{\sqrt{P_{1i}(\Delta f_{ij})\frac{f_s}{2} + P_{2j}(\Delta f_{ij})\frac{f_s}{2}}}{\frac{1}{2}A_g\left(\frac{a_{1i}}{a_{2j}} + \frac{a_{2j}}{\alpha_{1i}}\right)},$$

wherein $f_s$ is a sampling frequency, wherein $A_g$ is the angular gain of the dual mode resonator, wherein $a_1$ is the first mode amplitude of the dual mode resonator based on the PLL set at the first mode phase, wherein $a_2$ is the second mode amplitude of the dual mode resonator based on the PLL set at the second mode phase, wherein $f_1$ is the first mode frequency of the dual mode resonator based on the PLL set at the first mode phase, wherein $f_2$ is the second mode frequency of the dual mode resonator based on the PLL set at the second mode phase, wherein $\Delta f = |f_1 - f_2|$, wherein $P_1(\Delta f)$ is a PSD value of the first mode frequency of the dual mode resonator based on the PLL set at the first mode phase as demodulated at $\Delta f$, wherein $P_2(\Delta f)$ is a PSD value of the second mode frequency of the dual mode resonator based on the PLL set at the second mode phase as demodulated at $\Delta f$, wherein $a_{1i}$ is an $i^{th}$ increment of the first mode amplitude of the dual mode resonator based on the PLL set at the $i^{th}$ first mode phase, wherein $a_{2j}$ is a $j^{th}$ increment of the second mode amplitude of the dual mode resonator based on the PLL set at the $j^{th}$ second mode phase, wherein $f_{1i}$ is an $i^{th}$ increment of the first mode frequency of the dual mode resonator based on the PLL set at the $i^{th}$ first mode phase, wherein $f_{2j}$ is a $j^{th}$ increment of the second mode frequency of the dual mode resonator based on the PLL set at the $j^{th}$ second mode phase, wherein $\Delta f_{ij} = |f_{1i} - f_{2j}|$, wherein $P_{1i}(\Delta f_{ij})$ is a $k^{th}$ PSD value of the first mode frequency of the dual mode resonator based on the PLL set at the $i^{th}$ first mode phase as demodulated at $\Delta f_{ij}$, and wherein $P_{2j}(\Delta f_{ij})$ is a $k^{th}$ PSD value of the second mode frequency of the dual mode resonator based on the PLL set at the $j^{th}$ second mode phase as demodulated at $\Delta f_{ij}$.

20. A method of determining a driving signal for a dual mode resonator of a quadruple mass gyroscope, said method comprising:

driving, via a first mode phase-locked loop (PLL) set at first mode phase, a first mode of the dual mode resonator;

obtaining, via a detector, a first mode power spectral density (PSD) value of the dual mode resonator, a first mode amplitude of the dual mode resonator and a first mode frequency of the dual mode resonator based on the PLL set at the first mode phase;

repeating said driving the first mode of the dual mode resonator and said obtaining a respective first mode PSD value, a respective first mode amplitude of the dual mode resonator and a respective first mode frequency of the dual mode resonator based on the PLL set at a respective first mode phase a number n times to obtain n respective first mode PSD values of the dual mode resonator, n respective first mode amplitudes of the dual mode resonator and n respective first mode frequencies of the dual mode resonator, each repetition of said driving the first mode of the dual mode resonator and said obtaining a respective first mode PSD value, a respective first mode amplitude of the dual mode resonator and a respective first mode frequency of the dual mode resonator having the first mode PLL being set at a different respective first mode phase;

driving, via a second mode PLL set at second mode phase, a second mode of the dual mode resonator;

obtaining, via the detector, a second mode PSD value of the dual mode resonator, a second mode amplitude of the dual mode resonator and a second mode frequency of the dual mode resonator based on the PLL set at the second mode phase;

repeating said driving the second mode of the dual mode resonator and said obtaining a respective second mode PSD value, a respective second mode amplitude of the dual mode resonator and a respective second mode frequency of the dual mode resonator based on the PLL set at a respective second mode phase a number m times to obtain m respective second mode PSD values of the dual mode resonator, m respective second mode amplitudes of the dual mode resonator and m respective second mode frequencies of the dual mode resonator, each repetition of said driving the second mode of the dual mode resonator and said obtaining a respective second mode PSD value, a respective second mode amplitude of the dual mode resonator and a respective second mode frequency of the dual mode resonator having the second mode PLL being set at a different respective second mode phase;

determining an angle random walk, ARW, value of the dual mode resonator using the following equation, $$ARW\left(\frac{deg/\sec}{\sqrt{Hz}}\right) = 360 \frac{\sqrt{P_1(\Delta f)\frac{f_s}{2} + P_2(\Delta f)\frac{f_s}{2}}}{\frac{1}{2}A_g\left(\frac{a_1}{a_2} + \frac{a_2}{a_1}\right)},$$

wherein $f_s$ is a sampling frequency, wherein $A_g$ is the angular gain of the dual mode resonator, wherein $a_1$ is the first mode amplitude of the dual mode resonator based on the PLL set at the first mode phase, wherein $a_2$ is the second mode amplitude of the dual mode resonator based on the PLL set at the second mode phase, wherein $f_1$ is the first mode frequency of the dual mode resonator based on the PLL set at the first mode phase, wherein $f_2$ is the second mode frequency of the dual mode resonator based on the PLL set at the second mode phase, wherein $\Delta f = |f_1 - f_2|$, wherein $P_1(\Delta f)$ is a PSD value of the first mode frequency of the dual mode resonator based on the PLL set at the first mode phase as demodulated at $\Delta f$, wherein $P_2(\Delta f)$ is a PSD value of the second mode frequency of the dual mode resonator based on the PLL set at the second mode phase as demodulated at $\Delta f$, and wherein $\Delta f$ is at least 100 Hz.

* * * * *